United States Patent
Lung

(10) Patent No.: US 8,315,088 B2
(45) Date of Patent: *Nov. 20, 2012

(54) MULTIPLE PHASE CHANGE MATERIALS IN AN INTEGRATED CIRCUIT FOR SYSTEM ON A CHIP APPLICATION

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/008,436

(22) Filed: Jan. 18, 2011

(65) Prior Publication Data

US 2011/0116308 A1    May 19, 2011

Related U.S. Application Data

(63) Continuation of application No. 12/194,243, filed on Aug. 19, 2008, now Pat. No. 7,903,457.

(51) Int. Cl.
*G11C 11/00* (2006.01)

(52) U.S. Cl. .................. 365/163; 365/148; 365/189.011

(58) Field of Classification Search .................. 365/163, 365/148, 189.011
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,177,475 A | 12/1979 | Holmberg | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi | |
| 5,391,901 A | 2/1995 | Tanabe | |
| 5,515,488 A | 5/1996 | Hoppe et al. | |
| 5,534,712 A | 7/1996 | Ovshinsky et al. | |
| 5,550,396 A | 8/1996 | Tsutsumi | |

(Continued)

FOREIGN PATENT DOCUMENTS

WO    0079539 A1    12/2000

(Continued)

OTHER PUBLICATIONS

Yi, J. H. et al., "Novel Cell Structure of PRAM with Thin Metal Layer Inserted GeSbTe," IEEE IEDM Dec. 10, 2003, 4 pages.

(Continued)

*Primary Examiner* — Pho M Luu
(74) *Attorney, Agent, or Firm* — Haynes Beffel & Wolfeld LLP

(57) ABSTRACT

An integrated circuit includes a plurality of memory cells on a substrate, in which a first set of memory cells uses a first memory material, and a second set of memory cells uses a second memory material. The first and second memory materials have different properties such that the first and second sets of memory cells have different operational memory characteristics, such as switching speeds, retention and endurance.

14 Claims, 31 Drawing Sheets

U.S. PATENT DOCUMENTS

| | | | |
|---|---|---|---|
| 5,648,928 A | 7/1997 | Yoon et al. | |
| 5,687,112 A | 11/1997 | Ovshinsky | |
| 5,688,713 A | 11/1997 | Linliu et al. | |
| 5,716,883 A | 2/1998 | Tseng | |
| 5,754,472 A | 5/1998 | Sim | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,088,269 A * | 7/2000 | Lambertson | 365/185.28 |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,143,636 A * | 11/2000 | Forbes et al. | 438/587 |
| 6,147,395 A | 11/2000 | Gilgen | |
| 6,150,253 A | 11/2000 | Doan et al. | |
| 6,153,890 A | 11/2000 | Wolstenholme et al. | |
| 6,163,860 A | 12/2000 | Merritt | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,805,563 B2 | 10/2004 | Ohashi | |
| 6,815,704 B1 | 11/2004 | Chen | |
| 6,838,692 B1 | 1/2005 | Lung | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,956,261 B2 * | 10/2005 | Shibata | 257/306 |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg | |
| 6,992,932 B2 | 1/2006 | Cohen | |
| 7,023,009 B2 | 4/2006 | Kostylev et al. | |
| 7,033,856 B2 | 4/2006 | Lung | |
| 7,038,230 B2 | 5/2006 | Chen et al. | |
| 7,038,938 B2 | 5/2006 | Kang | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung | |
| 7,078,273 B2 | 7/2006 | Matsuoka et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,130,222 B1 * | 10/2006 | Ho et al. | 365/185.22 |
| 7,132,675 B2 | 11/2006 | Gilton | |
| 7,133,313 B2 * | 11/2006 | Shih | 365/185.18 |
| 7,151,273 B2 | 12/2006 | Campbell et al. | |
| 7,154,774 B2 | 12/2006 | Bedeschi et al. | |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |

| Patent No. | Date | Name | | Patent No. | Date | Name |
|---|---|---|---|---|---|---|
| 7,202,493 B2 | 4/2007 | Lung | | 2006/0124916 A1 | 6/2006 | Lung |
| 7,208,751 B2 | 4/2007 | Ooishi | | 2006/0126395 A1 | 6/2006 | Chen et al. |
| 7,214,958 B2 | 5/2007 | Happ | | 2006/0131555 A1 | 6/2006 | Liu et al. |
| 7,220,983 B2 | 5/2007 | Lung | | 2006/0138467 A1 | 6/2006 | Lung |
| 7,229,883 B2 | 6/2007 | Wang et al. | | 2006/0154185 A1 | 7/2006 | Ho et al. |
| 7,238,959 B2 | 7/2007 | Chen | | 2006/0157681 A1 | 7/2006 | Chen et al. |
| 7,238,994 B2 | 7/2007 | Chen et al. | | 2006/0163554 A1 | 7/2006 | Lankhorst et al. |
| 7,248,494 B2 | 7/2007 | Oh et al. | | 2006/0172067 A1 | 8/2006 | Ovshinsky et al. |
| 7,251,157 B2 | 7/2007 | Osada et al. | | 2006/0198183 A1 | 9/2006 | Kawahara et al. |
| 7,253,429 B2 | 8/2007 | Klersy et al. | | 2006/0205108 A1 | 9/2006 | Maimon et al. |
| 7,254,055 B2 | 8/2007 | Cho et al. | | 2006/0211165 A1 | 9/2006 | Hwang et al. |
| 7,254,059 B2 | 8/2007 | Li et al. | | 2006/0226409 A1 | 10/2006 | Burr et al. |
| 7,269,052 B2 | 9/2007 | Segal et al. | | 2006/0234138 A1 | 10/2006 | Fehlhaber et al. |
| 7,277,317 B2 | 10/2007 | Le Phan | | 2006/0237756 A1 | 10/2006 | Park et al. |
| 7,291,556 B2 | 11/2007 | Choi et al. | | 2006/0245236 A1 | 11/2006 | Zaidi |
| 7,309,630 B2 | 12/2007 | Fan et al. | | 2006/0250885 A1 | 11/2006 | Cho et al. |
| 7,321,130 B2 | 1/2008 | Lung et al. | | 2006/0266993 A1 | 11/2006 | Suh et al. |
| 7,323,708 B2 | 1/2008 | Lee et al. | | 2006/0284157 A1 | 12/2006 | Chen et al. |
| 7,332,370 B2 | 2/2008 | Chang et al. | | 2006/0284158 A1 | 12/2006 | Lung et al. |
| 7,336,526 B2 | 2/2008 | Osada et al. | | 2006/0284214 A1 | 12/2006 | Chen |
| 7,351,648 B2 | 4/2008 | Furukawa et al. | | 2006/0284279 A1 | 12/2006 | Lung et al. |
| 7,359,231 B2 | 4/2008 | Venkataraman et al. | | 2006/0286709 A1 | 12/2006 | Lung et al. |
| 7,364,935 B2 | 4/2008 | Lung | | 2006/0286743 A1 | 12/2006 | Lung et al. |
| 7,365,385 B2 | 4/2008 | Abbott | | 2006/0289848 A1 | 12/2006 | Dennison |
| 7,379,328 B2 | 5/2008 | Osada et al. | | 2007/0008786 A1 | 1/2007 | Scheuerlein |
| 7,385,235 B2 | 6/2008 | Lung | | 2007/0030721 A1 | 2/2007 | Segal et al. |
| 7,394,088 B2 | 7/2008 | Lung | | 2007/0037101 A1 | 2/2007 | Morioka |
| 7,397,060 B2 | 7/2008 | Lung | | 2007/0096162 A1 | 5/2007 | Happ et al. |
| 7,423,300 B2 | 9/2008 | Lung et al. | | 2007/0096248 A1 | 5/2007 | Philipp et al. |
| 7,426,134 B2 | 9/2008 | Happ et al. | | 2007/0097739 A1 | 5/2007 | Happ et al. |
| 7,433,226 B2 * | 10/2008 | Lung ............................ 365/158 | | 2007/0108077 A1 | 5/2007 | Lung et al. |
| 7,440,308 B2 | 10/2008 | Jeong et al. | | 2007/0108429 A1 | 5/2007 | Lung |
| 7,449,710 B2 | 11/2008 | Lung | | 2007/0108430 A1 | 5/2007 | Lung |
| 7,479,649 B2 | 1/2009 | Lung | | 2007/0108431 A1 | 5/2007 | Chen et al. |
| 7,515,461 B2 * | 4/2009 | Happ et al. ..................... 365/163 | | 2007/0109836 A1 | 5/2007 | Lung |
| 7,688,621 B2 * | 3/2010 | Cho et al. ...................... 365/163 | | 2007/0109843 A1 | 5/2007 | Lung et al. |
| 7,800,159 B2 * | 9/2010 | Widjaja et al. ................. 257/316 | | 2007/0111429 A1 | 5/2007 | Lung |
| 7,800,943 B2 * | 9/2010 | Ravasio et al. ............. 365/185.03 | | 2007/0115794 A1 | 5/2007 | Lung |
| 7,903,457 B2 * | 3/2011 | Lung ............................ 365/163 | | 2007/0117315 A1 | 5/2007 | Lai et al. |
| 7,913,215 B2 * | 3/2011 | Chou et al. ..................... 716/118 | | 2007/0120104 A1 | 5/2007 | Ahn et al. |
| 2001/0050873 A1 | 12/2001 | Tanaka et al. | | 2007/0121363 A1 | 5/2007 | Lung |
| 2002/0051381 A1 | 5/2002 | Numata et al. | | 2007/0121374 A1 | 5/2007 | Lung et al. |
| 2002/0070457 A1 | 6/2002 | Sun et al. | | 2007/0126040 A1 | 6/2007 | Lung |
| 2002/0113273 A1 | 8/2002 | Hwang et al. | | 2007/0131922 A1 | 6/2007 | Lung |
| 2003/0072195 A1 | 4/2003 | Mikolajick | | 2007/0138458 A1 | 6/2007 | Lung |
| 2003/0095426 A1 | 5/2003 | Hush et al. | | 2007/0147105 A1 | 6/2007 | Lung et al. |
| 2003/0186481 A1 | 10/2003 | Lung | | 2007/0153563 A1 | 7/2007 | Nirschl |
| 2004/0026686 A1 | 2/2004 | Lung | | 2007/0154847 A1 | 7/2007 | Chen et al. |
| 2004/0051094 A1 | 3/2004 | Ooishi | | 2007/0155172 A1 | 7/2007 | Lai et al. |
| 2004/0113137 A1 | 6/2004 | Lowrey | | 2007/0156949 A1 | 7/2007 | Rudelic et al. |
| 2004/0165422 A1 | 8/2004 | Hideki et al. | | 2007/0158632 A1 | 7/2007 | Ho |
| 2004/0248339 A1 | 12/2004 | Lung | | 2007/0158633 A1 | 7/2007 | Lai et al. |
| 2004/0256610 A1 | 12/2004 | Lung | | 2007/0158645 A1 | 7/2007 | Lung |
| 2005/0018526 A1 | 1/2005 | Lee | | 2007/0158690 A1 | 7/2007 | Ho et al. |
| 2005/0029502 A1 | 2/2005 | Hudgens | | 2007/0158862 A1 | 7/2007 | Lung |
| 2005/0052904 A1 | 3/2005 | Cho et al. | | 2007/0161186 A1 | 7/2007 | Ho |
| 2005/0062087 A1 | 3/2005 | Chen et al. | | 2007/0170881 A1 | 7/2007 | Noh et al. |
| 2005/0093022 A1 | 5/2005 | Lung | | 2007/0173019 A1 | 7/2007 | Ho et al. |
| 2005/0127349 A1 | 6/2005 | Horak et al. | | 2007/0173063 A1 | 7/2007 | Lung |
| 2005/0145984 A1 | 7/2005 | Chen et al. | | 2007/0176251 A1 | 8/2007 | Oh et al. |
| 2005/0167656 A1 | 8/2005 | Sun et al. | | 2007/0176261 A1 | 8/2007 | Lung |
| 2005/0191804 A1 | 9/2005 | Lai et al. | | 2007/0187664 A1 | 8/2007 | Happ |
| 2005/0201182 A1 | 9/2005 | Osada et al. | | 2007/0201267 A1 | 8/2007 | Happ et al. |
| 2005/0212024 A1 | 9/2005 | Happ | | 2007/0215852 A1 | 9/2007 | Lung |
| 2005/0212026 A1 | 9/2005 | Chung et al. | | 2007/0224726 A1 | 9/2007 | Chen et al. |
| 2005/0215009 A1 | 9/2005 | Cho | | 2007/0235811 A1 | 10/2007 | Furukawa et al. |
| 2005/0263829 A1 | 12/2005 | Song et al. | | 2007/0236989 A1 | 10/2007 | Lung |
| 2006/0006472 A1 | 1/2006 | Jiang | | 2007/0246699 A1 | 10/2007 | Lung |
| 2006/0038221 A1 | 2/2006 | Lee et al. | | 2007/0249090 A1 | 10/2007 | Philipp et al. |
| 2006/0066156 A1 | 3/2006 | Dong et al. | | 2007/0257300 A1 | 11/2007 | Ho et al. |
| 2006/0073642 A1 | 4/2006 | Yeh et al. | | 2007/0262388 A1 | 11/2007 | Ho et al. |
| 2006/0091476 A1 | 5/2006 | Pinnow et al. | | 2007/0267618 A1 | 11/2007 | Zaidi et al. |
| 2006/0094154 A1 | 5/2006 | Lung | | 2007/0274121 A1 | 11/2007 | Lung et al. |
| 2006/0108667 A1 | 5/2006 | Lung | | 2007/0285960 A1 | 12/2007 | Lung et al. |
| 2006/0110878 A1 | 5/2006 | Lung et al. | | 2007/0298535 A1 | 12/2007 | Lung |
| 2006/0110888 A1 | 5/2006 | Cho et al. | | 2008/0006811 A1 | 1/2008 | Philipp et al. |
| 2006/0113520 A1 | 6/2006 | Yamamoto et al. | | 2008/0012000 A1 | 1/2008 | Harshfield |
| 2006/0113521 A1 | 6/2006 | Lung | | 2008/0014676 A1 | 1/2008 | Lung et al. |
| 2006/0118913 A1 | 6/2006 | Yi et al. | | 2008/0025089 A1 | 1/2008 | Scheuerlein et al. |

| | | |
|---|---|---|
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |

FOREIGN PATENT DOCUMENTS

| | | |
|---|---|---|
| WO | 0145108 A1 | 6/2001 |
| WO | 0225733 A2 | 3/2002 |

OTHER PUBLICATIONS

Yonehara, T. et al., "Control of Grain Boundary Location by Selective Nucleation Over Amorphous Substrates," Mat. Res. Soc. Symp. Proc., vol. 106, 1998, pp. 21-26.
"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase -Change Memory Cell for Embedded and Stand-Alone Non-Volatile Memory Applications," Jun. 15-17, 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era- vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

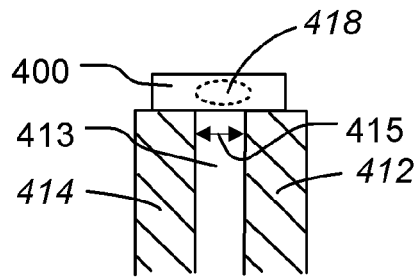
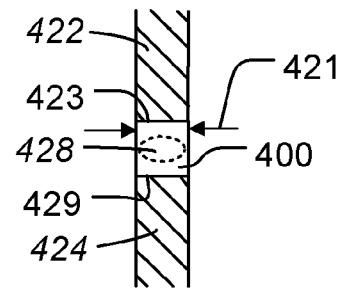
FIG. 4A     FIG. 4B
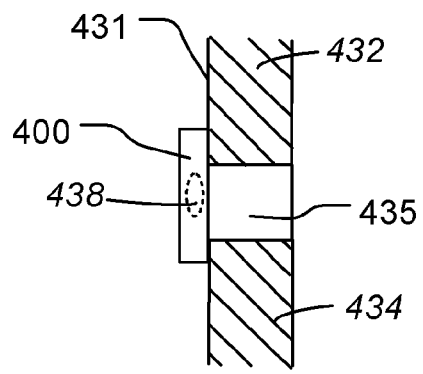
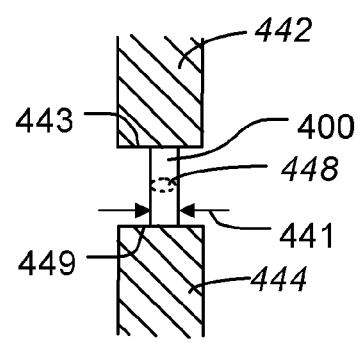
FIG. 4C     FIG. 4D
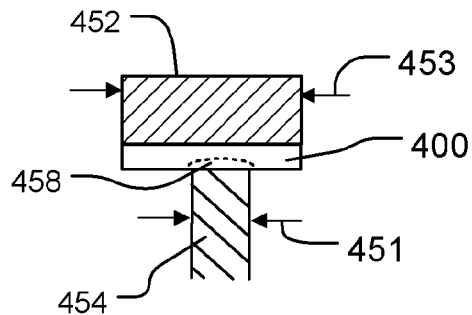
FIG. 4E

MULTIPLE PHASE CHANGE MATERIALS IN AN INTEGRATED CIRCUIT FOR SYSTEM ON A CHIP APPLICATION

RELATED APPLICATIONS

This application is a continuation of U.S. patent application No. 12/194,243 filed 19 Aug. 2008 (now U.S. Pat. No. 7,903,457), which application is incorporated by reference as if fully set forth herein.

PARTIES TO A JOINT RESEARCH AGREEMENT

International Business Machines Corporation, a New York corporation, and Macronix International Corporation, Ltd., a Taiwan corporation are parties to a Joint Research Agreement.

BACKGROUND OF THE INVENTION

1. Field of the Invention

The present invention relates to memory devices based on phase change based memory materials, including chalcogenide based materials and other programmable resistance materials, and methods for manufacturing such devices.

2. Description of Related Art

In general, system-on-chip (SOC) technology is the integration of multiple subsystems of an electronic system within a single integrated circuit, and may contain digital, analog, mixed-signal, and radio-frequency functions. The various types of subsystems that may be integrated within the integrated circuit include microprocessor and microcontroller cores, digital signal processors (DSPs), configurable logic units, memory blocks, timing sources, external interfaces, and power management circuits, among others. An SOC consists of both the hardware described above, as well as the software that controls the subsystems. The term "system-on-a-chip" may be used to describe complex application specific integrated circuits (ASIC), where many functions previously achieved by combining multiple integrated circuits on a board are now provided by one single integrated circuit. This level of integration greatly reduces the size and power consumption of the system, while generally also reducing manufacturing costs.

In order to fulfill the memory performance requirements for the various functions of the SOC, different types of memory circuits serving different purposes are typically embedded at various locations in the integrated circuit for memory applications such as random access memory (RAM), flash memory, and read only memory (ROM). However, integration of different types of memory devices for the various memory applications in an SOC can be difficult and result in highly complex designs and manufacturing processes.

It is therefore desirable to provide memory on a single integrated circuit addressing different memory performance requirements such as those demanded of the various functions of SOCs, while also addressing the issue of design integration. It is also desirable to provide methods for manufacturing such devices.

SUMMARY OF THE INVENTION

An integrated circuit as described herein comprises a plurality of memory cells on a substrate. The plurality of memory cells comprise a first set of memory cells comprising a first programmable resistance memory material, and a second set of memory cells comprising a second programmable resistance memory material. The first and second memory materials have different properties such that the first and second sets of memory cells have different operational memory characteristics.

A method for manufacturing an integrated circuit as described herein includes providing a memory access layer having a top surface, the memory access layer including first and second sets of electrodes extending to the top surface of the memory access layer. A first set of memory elements comprising a first memory material are formed contacting top surfaces of the first set of electrodes, and a second set of memory elements comprising a second memory material are formed contacting top surfaces of the second set of electrodes. The first and second memory materials have different properties such that the first and second sets of memory elements have different operational memory characteristics.

Sets of memory cells as described herein comprising memory materials having different properties as part of an SOC or other integrated circuit device result in the sets of memory cells providing different operational characteristics such as switching speed, cycle endurance, and data retention on the same chip. The sets of memory cells can exhibit its own memory function operational characteristics according to the requirements of the integrated circuit, and thus can address the different memory performance requirements such as those demanded of the various functions of SOCs on a single integrated circuit.

Other aspects and advantages of the present invention can be seen on review of the drawings, the detailed description and the claims, which follow.

BRIEF DESCRIPTION OF THE DRAWINGS

FIGS. 4A-4E illustrate cross-sectional views of various physical configurations for a memory element which may be implemented in the plurality of sets of memory cells.

DETAILED DESCRIPTION OF THE INVENTION

Figure 1:
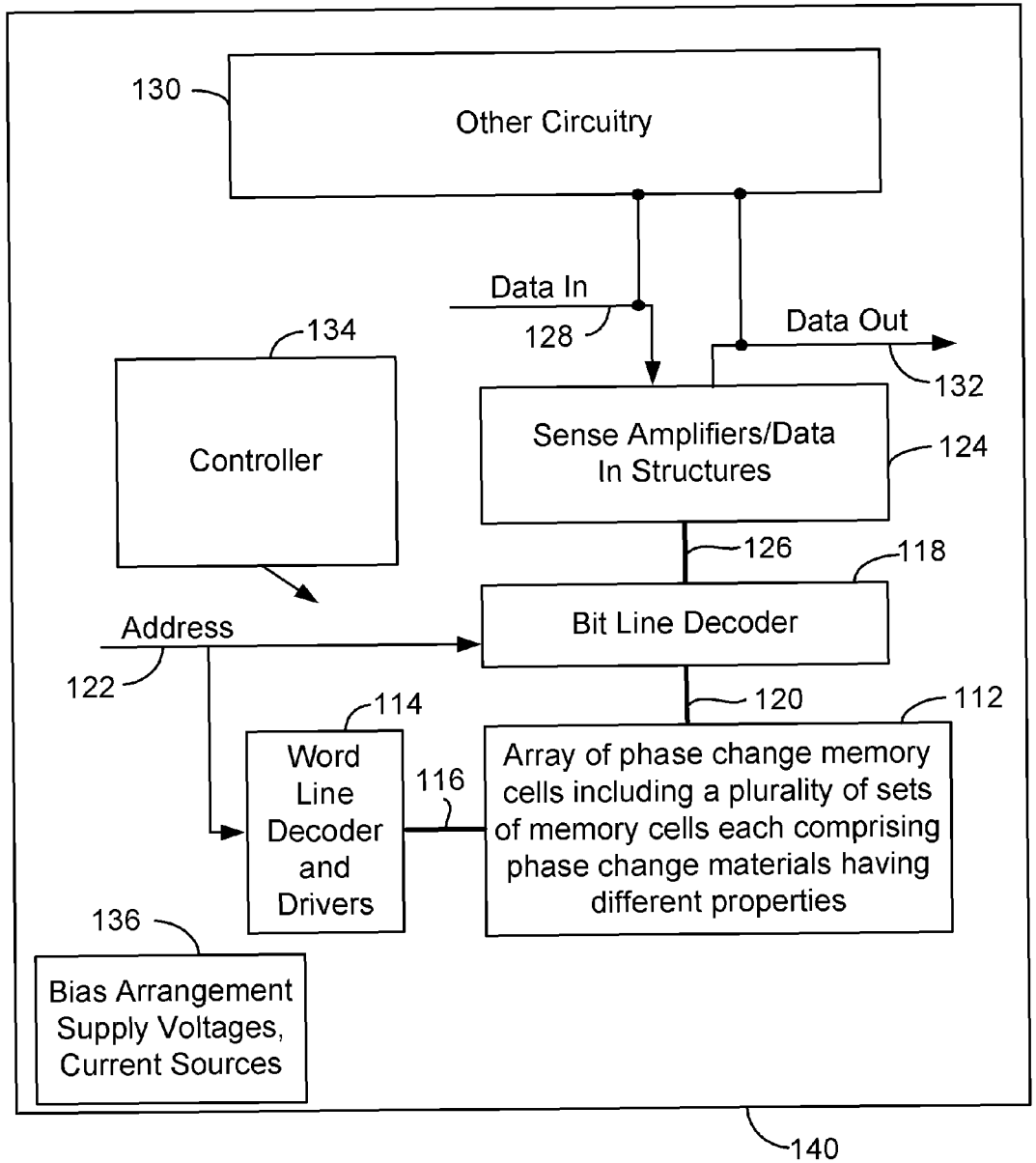
FIG. 1 is a block diagram of a first embodiment of an integrated circuit including a memory array including a plurality of sets of memory cells comprising phase change materials having different properties.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram of a first embodiment of an integrated circuit 110 including a memory array 112 of phase change memory cells including a plurality of sets of memory cells comprising phase change materials having different properties. As described in more detail below, the phase change materials have different properties such that the sets of phase change memory cells have different operational memory characteristics.

A word line decoder 114 having read, set and reset modes is coupled to and in electrical communication with a plurality of word lines 116 arranged along rows in the memory array 112. A bit line (column) decoder 118 is in electrical communication with a plurality of bit lines 120 arranged along columns in the array 112 for reading, setting, and resetting the phase change memory cells (not shown) in array 112. Addresses are supplied on bus 122 to word line decoder and drivers 114 and bit line decoder 118. Sense amplifiers and data-in structures in block 124, including voltage and/or current sources for read, set, and reset modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, controls the application of bias arrangement supply voltages and current sources 136, such as read, program, erase, erase verify and program verify voltages and/or currents. The controller 134 controls the application the bias arrangement supply voltages and current sources 136 according to which of the sets of memory cells of the array 112 is being accessed. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

The array 112 includes a plurality of sets of memory cells, each of the sets comprising phase change materials having different properties such that the sets of memory cells have different operational memory characteristics. The sets of memory cells are arranged at different locations in the array 112 and may be different sizes, and in embodiments can be arranged in different units of the array 112, for example different banks, blocks, or sections of the array 112.

The different properties of the plurality of phase change materials depend upon the desired operational memory characteristics of the respective sets of phase change memory cells 200, 250. In embodiments the different properties of the phase change materials may include, for example, differences in one or more of electrical conductivity, thermal conductivity, heat capacity, thermal expansion, thermal stability, transition temperature, and melting temperature. The resulting different operational memory characteristics may include, for example, one or more of current-voltage behavior, read speed, write speed, power consumption, resistance ranges associated with a stored data value, relaxation time, data retention, switching speed, and cycling endurance.

Each of the plurality of phase change materials of the array 112 may comprise, for example, one or more materials from the group of Zn, To, Tl, Ge, Sb, Te, Se, In, Ti, Ga, Bi, Sn, Cu, Pd, Pb, Ag, S, C, Si, O, P, As, N and Au.

Embodiments of the phase change materials of the array 112 include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

As described above, the different properties of the phase change materials of the array 112 result in desired memory functions of the array 112. In embodiments the different properties of the phase change materials of the array 112 may be achieved, for example, by the sets of memory cells comprising different chalcogenide materials, by comprising the same chalcogenide materials having at least one of different dopants and different dopant concentrations, and by comprising chalcogenide alloys having different compositions of Ge, Te, and Sb.

The different properties of the phase change materials result in the sets of memory cells each exhibiting its own memory function operational characteristics according to the requirements of the array 112. The memory functions depend upon the implementation of the integrated circuit 140 and may include, for example, sets of memory cells having characteristics of and implemented as random access memory (RAM), flash memory, read-only memory (ROM), and fuse memory.

The following are some exemplary types of phase change materials which may be implemented in the sets of memory cells of the array 112 to have different memory function operational characteristics to address different memory performance requirements on a single integrated circuit.

Static random access memory (SRAM) and dynamic random access memory (DRAM) each typically requires a very fast phase change material and good cycling endurance, and may provide working memory for the integrated circuit. However, extended data retention is not generally necessary. An example of a suitable material is $Ge_xSb_y$.

Flash memory, including NOR and NAND array configurations, typically requires a phase change material having very good data retention characteristics, and may store execution code and user data for the integrated circuit. However, fast switching speed and very good cycling endurance are not generally needed. An example of a suitable material is $G_2S_2T_5$.

Read-only memory (ROM) and programmable read-only memory (PROM), sometimes called fuse memory (because the memory is programmed once), typically require very good data retention and small reset current to minimize the cell size. The phase change material for this type of memory can exhibit slow program/erase times. An example of a suitable material is nitrogen doped $G_2S_2T_5$; this doped material provides improved data retention over $G_2S_2T_5$ but with a somewhat slower operating speed.

The memory functional operational characteristics of each set of memory cells in the array 112 are distinguished by the address of the memory cells and determines the characteristics of the signals sent from controller 134 to couple bias circuitry (bias arrangement supply voltages, current sources 136) to apply pulses to operate (e.g. reading and programming operations) the memory cells of the array 112. For example, in a reading operation of the first set of memory cells a first read pulse may be applied to the phase change memory cells in the first set of memory cells, and in a reading operating of the second set of memory cells a second read pulse may be applied to the phase change memory cells in the second set of memory cells, the first and second read pulses having different values for at least one of pulse width and pulse height depending upon the characteristics of the sets of memory cells. Similarly, in a programming operation of the first set of memory cells a first program pulse may be applied to the phase change memory cells in the first set of memory cells, and in a programming operating of the second set of memory cells a second program pulse may be applied to the phase change memory cells in the second set of memory cells, the first and second program pulses having different values for at least one of pulse width and pulse height. In some embodiments the drivers and sense amplifiers may consist of various types of circuitry corresponding to the sets of the memory cells and having different performance properties, and/or may be operable to different states depending upon which of set of memory cells an operation is to be performed on.

Figure 2:
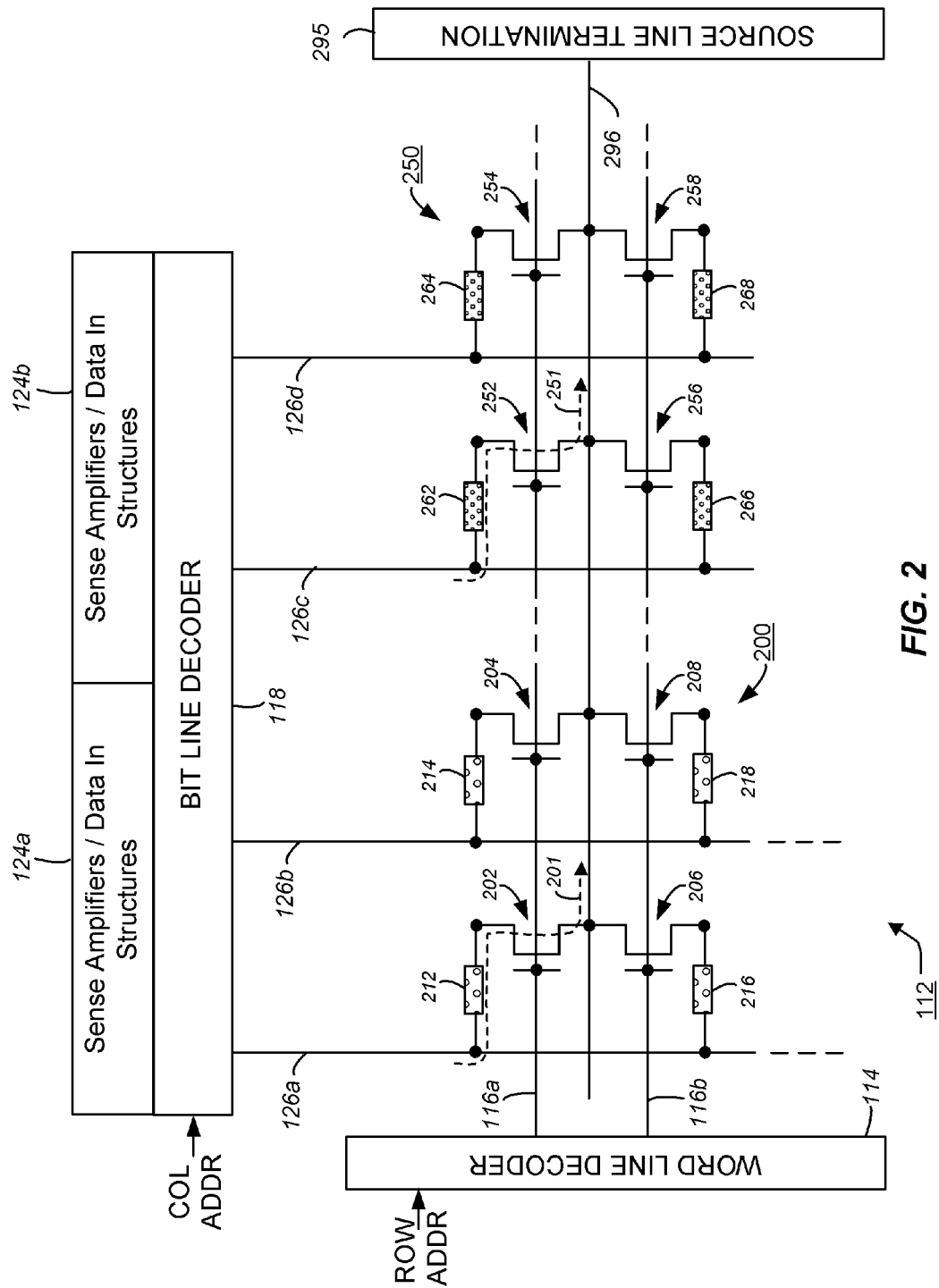
FIG. 2 illustrates a schematic diagram of an embodiment of array including a first set of memory cells comprising a first phase change material and a second set of memory cells comprising a second phase change material.

FIG. 2 illustrates a schematic diagram of an embodiment of array 112 including a first set of memory cells 200 comprising a first phase change material and a second set of memory cells 250 comprising a second phase change material, the first and second phase change materials having different properties such that the first and second sets of phase change memory cells 200, 250 have different operational memory characteristics.

In FIG. 2 each of the memory cells includes an access transistor and a memory element comprising phase change material. The first set of memory cells 200 includes memory cells 202, 204, 206, 208 having respective memory elements 212, 214, 216, 218 comprising a first phase change material, and the second set of memory cells 250 includes memory cells 252, 254, 256, 258 having respective memory elements 262, 264, 266, 268 comprising a second phase change material, representing a small portion of an array that can includes millions of memory cells. The first and second sets of memory cells 200, 250 may comprise different numbers of memory cells in some embodiments.

The first and second phase change materials have different properties such that the first and second sets of phase change memory cells 200, 250 have different operational memory characteristics. The different properties of the first and second phase change materials depend upon the preferred different operational memory characteristics of the first and second sets of phase change memory cells 200, 250. The different properties of the first and second phase change materials may include, for example, one or more of electrical conductivity, thermal conductivity, heat capacity, thermal expansion, thermal stability, transition temperature, melting temperature, crystallization time, power, and current, and amorphization time, power, and current. The resulting different operational memory characteristics may include, for example, one or more of current-voltage behavior, read speed, write speed, power consumption, resistance ranges associated with a stored data value, relaxation time, data retention, switching speed, and cycling endurance.

The array 112 includes a plurality of word lines 116 including word lines 116a, 116b extending in parallel in a first direction, and a plurality of bit lines 126 including bit lines 126a, 126b, 126c, 126d extending in parallel in a second direction perpendicular to the first direction. In FIG. 2 the first and second sets of memory cells 200, 250 are arranged along the word lines 116. Alternatively, the first and second sets of memory cells 200, 250 may be arranged along the bit lines 126.

Sources of each of the four access transistors illustrated for the first set of memory cells 200 are connected in common to source line 296 that terminates in a source line termination circuit 295, such as a ground terminal. In another embodiment the sources of the access devices are not electrically connected, but independently controllable.

Sources of each of the four access transistors illustrated for the second set of memory cells 250 are connected in common to source line 296. In another embodiment the sources of the access devices are not electrically connected, but independently controllable.

The source line termination circuit 295 may include bias circuits such as voltage and current sources, and decoding circuits for applying bias arrangements, other than ground, to the source lines 296 in some embodiments.

Memory cell 202 is representative of the memory cells of the first set of memory cells 200 of array 112. Word line 116a is coupled to the gate of the access transistor of memory cell 202, and the memory element 212 is arranged between the drain of the access transistor and bit line 126a. Alternatively, the memory element 212 may be on the source side of the access transistor.

Reading or writing to memory cell 202 can be achieved by coupling bias arrangement supply voltages and current sources 136 to provide appropriate voltage and/or current pulses to the word line 116a, bit line 126a, and source line 296 to turn on the access transistor and induce current in path 201 to flow from the bit line 126a to the source line 296a, or vice-versa. The level and duration of the pulses applied is dependent upon the operation performed, e.g. a reading operation or a writing operation.

In a reset (or erase) operation of the memory cell 202, word line decoder 114 facilitates providing word line 116a with a suitable voltage pulse to turn on the access transistor of the memory cell 202. Bit line decoder 118 facilitates supplying a voltage pulse to bit line 126a of suitable amplitude and duration to induce a current to flow through the memory element 212, the current raising the temperature of an active region of the memory element 212 above the transition temperature of the first phase change material and also above the melting temperature to place the active region in a liquid state. The current is then terminated, for example by terminating the voltage pulses on the word line 116a and bit line 126a, resulting in a relatively quick quenching time as the active region rapidly cools to stabilize to a high resistance generally amorphous phase. The reset operation can also comprise more than one pulse, for example using a pair of pulses.

In a set (or program) operation of memory cell 202, word line decoder 114 facilitates providing word line 116a with a suitable voltage pulse to turn on the access transistor of the memory cell 202. Bit line decoder 118 facilitates supplying a voltage pulse to bit line 126a of suitable amplitude and duration to induce a current to flow through the memory element 212, the current sufficient to raise the temperature of at least a portion of the active region above the transition temperature of the first phase change material and cause a transition of at least a portion of the active region from the amorphous phase to a crystalline phase, this transition lowering the resistance of the memory element 212 and setting the memory cell 202 to the desired state.

In a read (or sense) operation of the data value stored in the memory cell 202, word line decoder 114 facilitates providing word line 116a with a suitable voltage pulse to turn on the access transistor of the memory cell 202. Bit line decoder 118 facilitates supplying a voltage pulse to bit line 126a of suitable amplitude and duration to induce current to flow through the memory element 212, the current insufficient to cause a change in the resistive state of the memory element 212. The current through the memory cell 202 is dependent upon the resistance of the memory element 212 and thus the data value stored in the memory cell 202. Thus, the data value stored in the memory cell 202 may be determined by comparison of the current on the bit line 126a with a suitable reference by sense amplifiers of block 124a.

Memory cell 252 is representative of the memory cells of the second set of memory cells 250 of array 112. Word line 116a is coupled to the gate of the access transistor of memory cell 252, and the memory element 262 is arranged between the drain of the access transistor and bit line 126c. Alternatively, the memory element 262 may be on the source side of the access transistor.

Reading or writing to memory cell 252 can be achieved by coupling bias arrangement supply voltages and current sources 136 to provide appropriate voltage and/or current pulses to the word line 116a, bit line 126c, and source line 296 to turn on the access transistor and induce current in path 251 to flow from the bit line 126c to the source line 296, or vice-versa. The level and duration of the pulses applied is dependent upon the operation performed, e.g. a reading operation or a writing operation.

In a reset (or erase) operation of the memory cell 252, word line decoder 114 facilitates providing word line 116a with a suitable voltage pulse to turn on the access transistor of the memory cell 252. Bit line decoder 118 facilitates supplying a voltage pulse to bit line 126c of suitable amplitude and duration to induce a current to flow through the memory element 262, the current raising the temperature of an active region of the memory element 262 above the transition temperature of the second phase change material and also above the melting temperature to place the active region in a liquid state. The current is then terminated, for example by terminating the voltage pulses on the word line 116a and bit line 126c, resulting in a relatively quick quenching time as the active region rapidly cools to stabilize to a high resistance generally amorphous phase. The reset operation can also comprise more than one pulse, for example using a pair of pulses.

In a set (or program) operation of memory cell 252, word line decoder 114 facilitates providing word line 116a with a suitable voltage pulse to turn on the access transistor of the memory cell 252. Bit line decoder 118 facilitates supplying a voltage pulse to bit line 126c of suitable amplitude and duration to induce a current to flow through the memory element 252, the current sufficient to raise the temperature of at least a portion of the active region above the transition temperature of the second phase change material and cause a transition of at least a portion of the active region from the amorphous phase to a crystalline phase, this transition lowering the resistance of the memory element 252 and setting the memory cell 252 to the desired state.

In a read (or sense) operation of the data value stored in the memory cell 252, word line decoder 114 facilitates providing word line 116a with a suitable voltage pulse to turn on the access transistor of the memory cell 202. Bit line decoder 118 facilitates supplying a voltage pulse to bit line 126c of suitable amplitude and duration to induce current to flow through the memory element 262, the current insufficient to cause a change in the resistive state of the memory element 262. The current through the memory cell 252 is dependent upon the resistance of the memory element 262 and thus the data value stored in the memory cell 252. Thus, the data value stored in the memory cell 252 may be determined by comparison of the current on the bit line 126a with a suitable reference by sense amplifiers of block 124b.

It will be understood that the memory array 112 is not limited to the array configuration illustrated in FIG. 2, and additional array configurations can also be used including implementing different configurations for each of the first and second sets of memory cells 200, 250.

In the illustration of FIG. 2 the array 112 includes first and second sets of memory cells 200, 250 comprising first and second phase change materials respectively. However, it will be understood that the array 112 is not limited to two phase change materials having different properties, and the present invention includes two or more different phase change materials having different properties such that corresponding sets of memory cells have different operational memory characteristics.

For example, in embodiments the array 112 may include a third set of phase change memory cells comprising a third phase change material, the third phase change material having different properties from the first and second phase change materials such that the third set of phase change memory cells have different operational memory characteristics than the first and second sets of phase change memory cells. The third set of memory cells may, for example, be arranged along the bit lines 126 coupled to the first and second sets of memory cells 200, 250, or as another example may be arranged along the word lines 116 of the first and second sets of memory cells 200, 250. Additionally, in an embodiment the array 112 also includes a fourth set of phase change memory cells comprising a fourth phase change material, the fourth phase change material having different properties from the first, second, and third phase change materials such that the fourth set of phase change memory cells have different operational memory characteristics than the first, second, and third phase change memory cells.

In the illustrated embodiment of FIG. 2 the first and second sets of memory cells 200, 250 comprise field effect transistor access devices. Alternatively, the first and second sets of memory cells 200, 250 may each comprise the same type of other access devices such as diodes or bipolar junction transistors.

Figure 3:
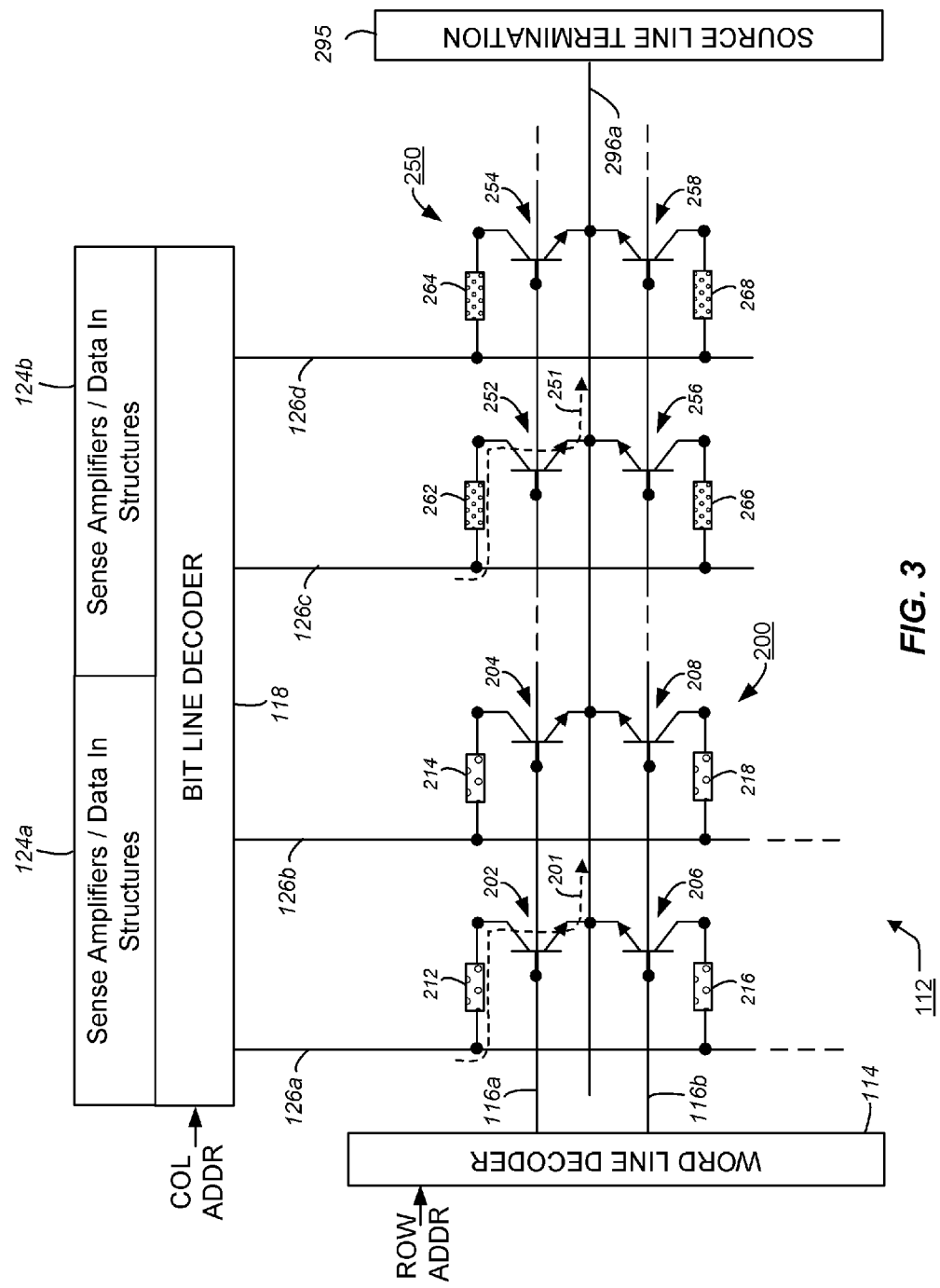
FIG. 3 illustrates a schematic diagram of a second embodiment of the array.

FIG. 3 illustrates a second embodiment of array 112 in which the first and second sets of memory cells 200, 250 comprise bipolar junction transistor access devices. Other alternative embodiments may include implementation of diode access devices. In some embodiments the first and second sets of memory cells 200, 250 comprise different types of access devices.

In some embodiments the plurality of sets of memory cells of array 112 may comprise memory elements having the same physical configuration. Alternatively, the plurality of sets of memory cells of array 112 may comprise various types of memory elements having different physical configurations. FIGS. 4A-4E illustrate cross-sectional views of various physical configurations for a memory element 400 which may implemented in the plurality of sets of memory cells of array 112. As will be understood, the present invention is not limited to the types of memory element physical configurations illustrated in FIGS. 4A-4E.

FIG. 4A is a simplified cross-sectional view illustrating a first configuration for memory element 400 coupled to first and second electrodes 412, 414. The first electrode 412 may, for example, be coupled to a terminal of an access device such as a diode or transistor, while the second electrode 414 may be coupled to a bit line.

A dielectric spacer 413 having a width 415 separates the first and second electrodes 412, 414. The phase change material of memory element 400 extends across the dielectric spacer 413 and contacts the first and second electrodes 412,

414, thereby defining an inter-electrode path between the first and second electrodes 412, 414 having a path length defined by the width 415 of the dielectric spacer 413. In operation, as current passes between the first and second electrodes 412, 414 and through the memory element 400, the active region 418 of the phase change material of the memory element 400 heats up more quickly than the remainder of the memory element 400.

FIG. 4B is a simplified cross-sectional view illustrating a second configuration for memory element 400 coupled to first and second electrodes 422, 424. The phase change material of the memory element 400 has an active region 428 and contacts the first and second electrodes 422, 424 at top and bottom surfaces 423, 429 respectively. The memory element 400 has a width 421 the same as that of the first and second electrodes 422, 424.

FIG. 4C is a simplified cross-sectional view illustrating a third configuration for memory element 400 coupled to first and second electrodes 432, 434, the phase change material of memory element 400 having an active region 438. The first and second electrodes 432, 434 are separated by dielectric spacer 435. The first and second electrodes 432, 434 and the dielectric spacer 435 have a sidewall surface 431. The phase change material of memory element 400 is on the sidewall surface 431 and extends across the dielectric spacer 435 to contact the first and second electrodes 432, 434.

FIG. 4D is a simplified cross-sectional view illustrating a fourth configuration for memory element 400 coupled to first and second electrodes 442, 444. The phase change material of memory element 400 has an active region 448 and contacts the first and second electrodes 442, 444 at top and bottom surfaces 443, 449 respectively. The memory element 400 has a width 441 less than that of the first and second electrodes 442, 444.

FIG. 4E is a simplified cross-sectional view illustrating a fifth configuration for memory element 400 coupled to first and second electrodes 454, 452. The first electrode 454 has a width 451 less than width 453 of the second electrode 452 and memory element 400. Because of the difference between width 451 and width 453, in operation the current density in the phase change material of memory element 400 is largest in the region adjacent the first electrode 454, resulting in the active region 458 having a "mushroom" shape as shown in the Figure.

In the embodiment of FIG. 1 the plurality of sets of memory cells are arranged at different locations within a single memory array 112, and the plurality of sets of memory cells share common control circuitry and bias circuitry.

Figure 5:
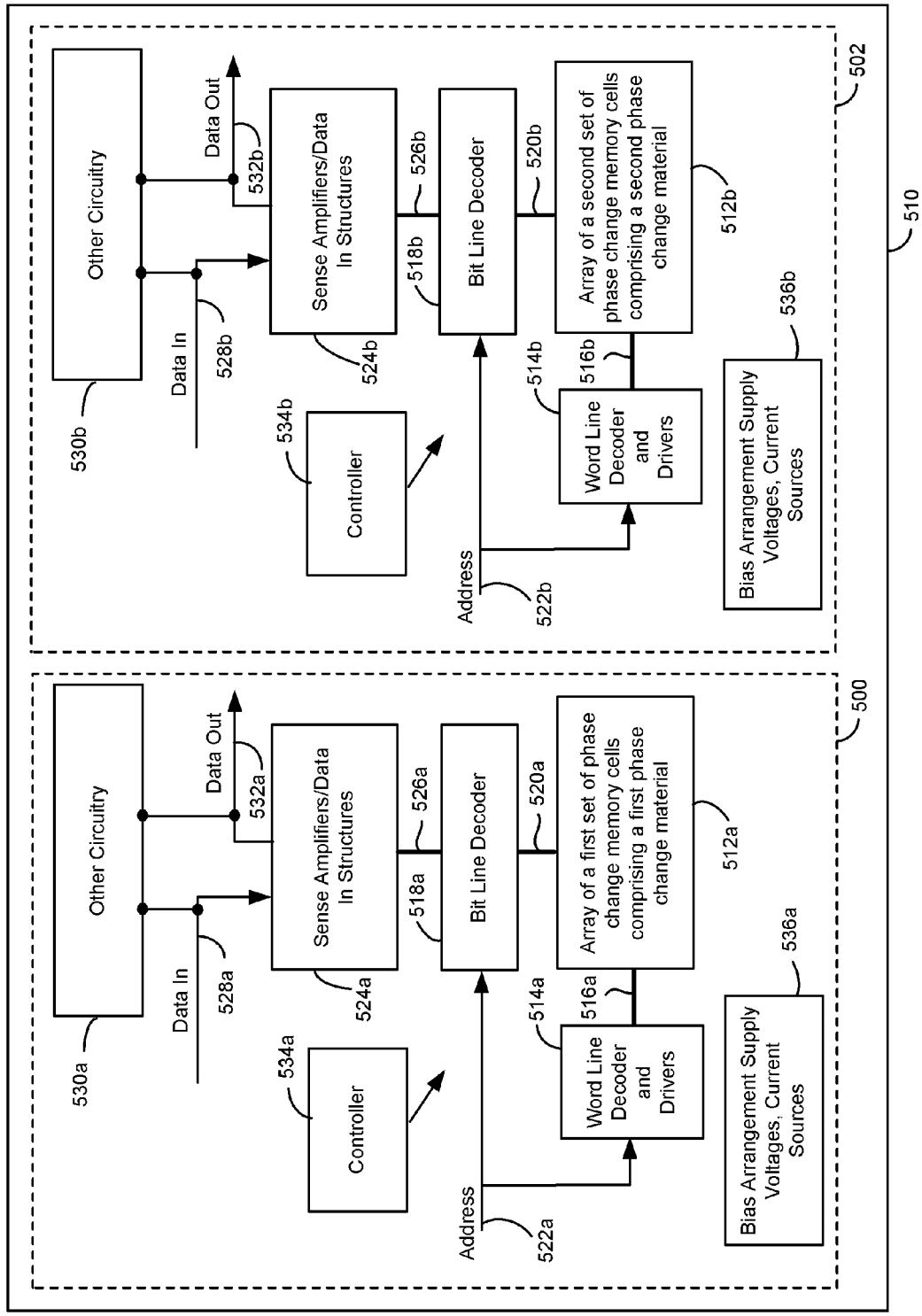
FIG. 5 is a block diagram of a second embodiment of an integrated circuit comprising a plurality of arrays including a first memory array of a first set of memory cells comprising a first phase change material, and a second memory array of a second set of memory cells comprising a second phase change material.

FIG. 5 is a block diagram of a second embodiment of an integrated circuit 510 comprising a plurality of memory arrays 512 including a first memory array 512a of a first set of memory cells comprising a first phase change material. The plurality of memory arrays 512 include a second memory array 512b of a second set of memory cells comprising a second phase change material, the first and second arrays 512a, 512b at different locations 500, 502 on the substrate of the integrated circuit 510 and spaced away from one another. The first and second phase change materials have different properties such that the first and second sets of memory cells of arrays 512a, 512b have different operational characteristics such as those described above. In FIG. 5 two arrays 512a, 512b are illustrated, although it will be understood the present invention is not limited as such and the present invention includes two or more arrays 512 on the integrated circuit 510.

Since the first set of memory cells is arranged in the first array 512a, and the second set of memory cells is arranged in the second array 512b, the first and second arrays 512a, 512b can be configured to further address the various requirements of the memory functions of the first and second array 512b. For example, in RAM memory the memory cells are arranged to provide random access, and shorter bit line/word line lengths are typically desired to increase program/erase speeds. In flash memory the memory cells may be arranged in a NAND or NOR array configuration to provide good array efficiency, and longer bit line/word line lengths are typically desired to increase array efficiency and since switching speed of flash may be less of a concern. To increase array area efficiency in ROM and fuse memory, longer bit line/word line lengths are typically desired.

As shown in FIG. 5 the arrays 512a, 512b include individual components discussed above with reference to FIG. 1, and thus a discussion of the operation of the individual components will not be repeated here. The arrays 512a, 512b may comprise any of the phase change materials, access devices, array structures, and memory element physical configurations discussed above with reference to the array 112.

In FIG. 5 each of the plurality of arrays 512 include separate control circuitry and bias circuitry. The memory functional operational characteristics of each set of memory cells in the respective arrays 512 determines the characteristics of the signals sent from respective controllers 534 to couple corresponding bias circuitry (bias arrangement supply voltages, current sources 536) to apply pulses to operate (e.g. reading and programming operations) the respective memory cells of the arrays 512. For example, in a reading operation a first read pulse may be applied to a phase change memory cell in a first set of memory cells of array 512a by the corresponding bias and control circuitry, and a second read pulse may be applied to a phase change memory cell in a second set of memory cells of array 512b by the corresponding bias and control circuitry, the first and second read pulses having different values for at least one of pulse width and pulse height depending upon the characteristics of the sets of memory cells. Similarly, in a programming operation a first program pulse may be applied to a phase change memory cell in a first set of memory cells of array 512a by the corresponding bias and control circuitry, and a second program pulse may be applied to a phase change memory cell in a second set of memory cells of array 512b by the corresponding bias and control circuitry, the first and second program pulses having different values for at least one of pulse width and pulse height depending upon the characteristics of the sets of memory cells.

In FIG. 5 the first and second arrays 512a, 512b each comprise a single phase change material. However, the present invention is not limited as such and the first and second arrays 512a, 512b may each comprise one or more phase change materials arranged, for example, as discussed above with reference to array 112.

FIGS. 6-11 illustrate steps in a fabrication sequence for manufacturing first and second sets of memory cells comprising first and second phase change materials as described herein.

Figure 6:
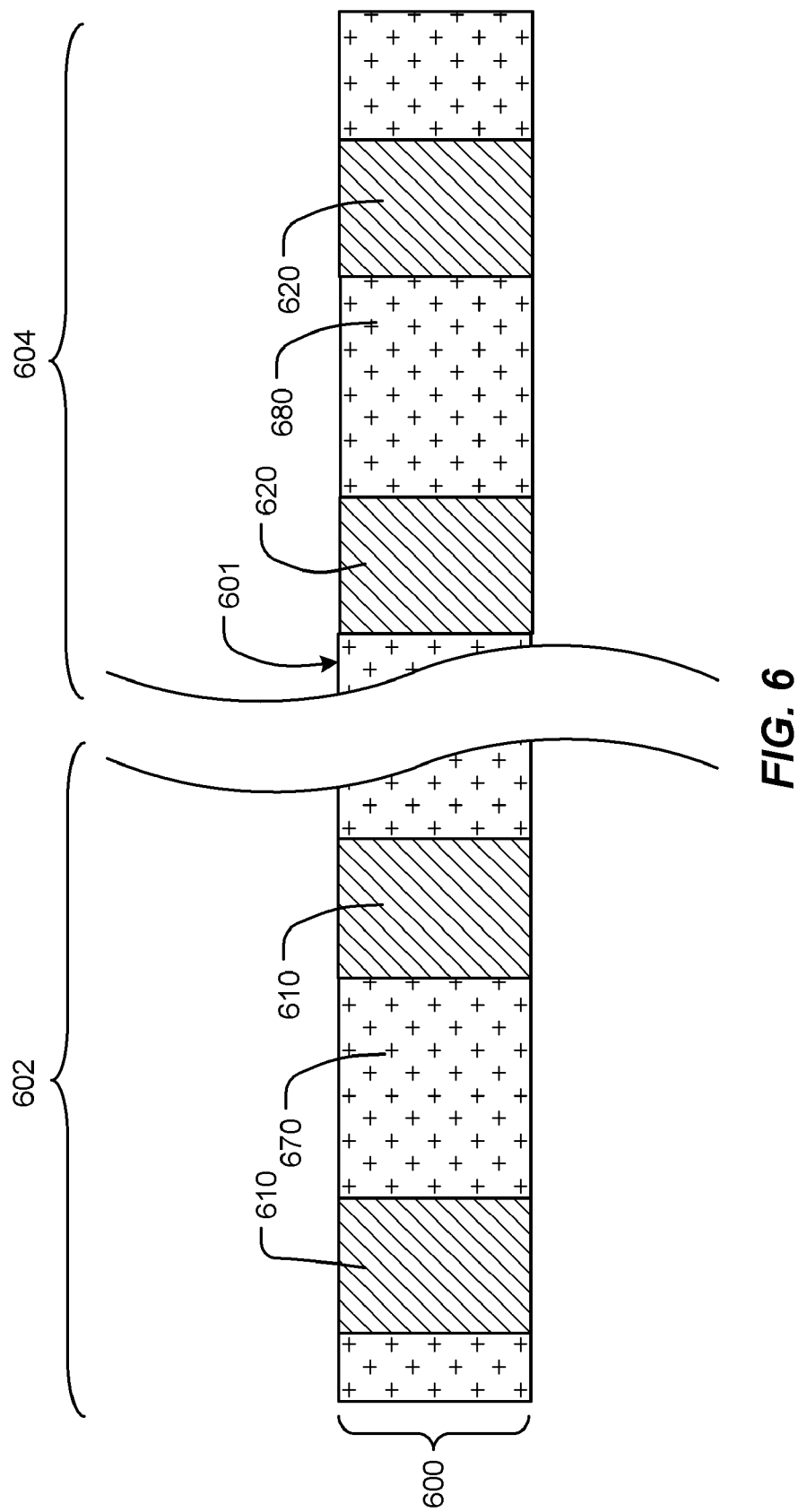
FIGS. 6-7, 8A-B, 9, 10A-B, 11 illustrate steps in a fabrication sequence for manufacturing first and second sets of memory cells comprising first and second phase change materials as described herein.

FIG. 6 illustrates a cross-sectional view of a first step of providing a memory access layer 600 having a top surface 601 and including a region 602 for a first set of memory cells and a region 604 for a second set of memory cells. The regions 602, 604 may be located within the same array (for example array 112 of FIG. 1) or may be located in separate arrays (for example arrays 512a and 512b of FIG. 5). The memory access layer 600 includes a first set of conductive contacts 610 within region 602 extending through dielectric 670 to underlying access circuitry (not shown) and to the top surface 601, and a second set of conductive contacts 620 within region 604 extending through dielectric 680 to underlying access circuitry (not shown) to the top surface 601. In some embodiments the dielectrics 670, 680 comprise the same dielectric material, for example silicon oxide.

The memory access layer 600 may formed by standard processes as known in the art, and the configuration of the first and second sets of conductive contacts 610, 620 depends upon the array configuration in which the sets of memory cells as described herein are implemented. Generally, the memory access layer 600 may include access devices such as transistors and diodes, word lines and source lines, conductive plugs, and doped regions within a semiconductor substrate.

The conductive contacts 610, 620 may comprise, for example, TiN or TaN. TiN may be preferred in embodiments in which the subsequently formed memory elements comprise GST because it forms good contact with GST, it is a common material used in semiconductor manufacturing, and it provides a good diffusion barrier at the higher temperatures at which GST transitions, typically in the 600-700° C. range. Alternatively, the conductive contacts 610, 620 may be TiAlN or TaAlN, or comprises, for further examples, one or more elements selected from the group consisting of Ti, W, Mo, Al, Ta, Cu, Pt, Ir, La, Ni, N, O, and Ru and combinations thereof. In some embodiments the conductive contacts 610, 620 may comprise a doped semiconductor material which may form a terminal of an access device such as a diode or transistor, or many comprise a conductive layer of material such as a silicide.

Figure 7:
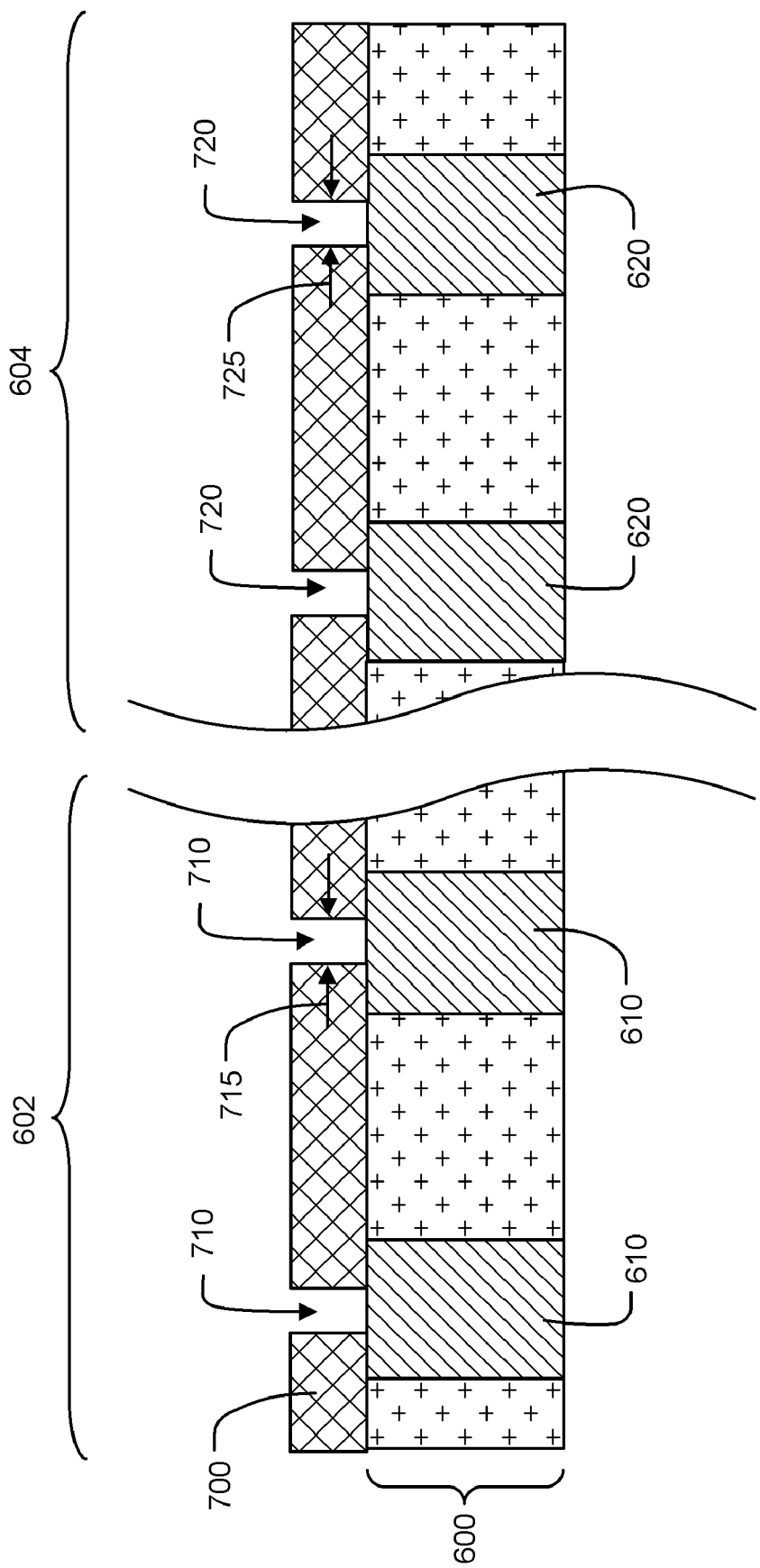

Next, a dielectric 700 is formed on the top surface 601 of the memory access layer 600, a first set of vias 710 are formed through the dielectric 700 to expose top surfaces of the first set of conductive contacts 610, and a second set of vias 720 are formed through the dielectric 700 to expose top surfaces of the second set of conductive contacts 620, resulting in the structure illustrated in the cross-sectional view of FIG. 7.

The first and second sets of vias 710, 720 have respective widths 715, 725 which are preferably sublithographic, in the illustrated embodiment the widths 715, 725 are substantially the same. As used herein, the term "substantially" is intended to accommodate manufacturing tolerances.

In the illustrated embodiment the vias 710, 720 have a circular cross-section and thus the widths 715, 725 are diameters. However, in embodiments the vias 710, 720 may have a cross-section that is square, elliptical, rectangular, or somewhat irregularly shaped, depending on the manufacturing technique applied to form the vias 710, 720.

The vias 710, 720 having a respective sublithographic widths 715, 725 can be formed, for example, using methods, materials, and processes as disclosed in U.S. patent application Ser. No. 11/855,979 filed 14 Sep. 2007 entitled "Phase Change Memory Cell in Via Array with Self-Aligned, Self-Converged Bottom Electrode and Method for Manufacturing", which is incorporated by reference herein. For example, an isolation layer is formed on the dielectric 700 and a sacrificial layer is formed on the isolation layer. Next, a mask having openings close to or equal to the minimum feature size of the process used to create the mask is formed on the sacrificial layer, the openings overlying the locations of the vias 710, 720. The isolation layer and the sacrificial layer are then selectively etched using the mask, thereby forming openings in the isolation and sacrificial layers and exposing a top surface of the dielectric 700. After removal of the mask, a selective undercutting etch is performed on the openings such that the isolation layer is etched while leaving the sacrificial layer and the dielectric 700 intact. A fill material is then formed in the openings, which due to the selective undercutting etch process results in a self-aligned void in the fill material being formed within each opening. Next, an anisotropic etching process is performed on the fill material to open the voids, and etching continues until the dielectric 700 is exposed in the region below the openings, thereby forming a sidewall spacer comprising fill material within each opening. The sidewall spacers have an opening dimension substantially determined by the dimensions of the voids, and thus can be less than the minimum feature size of a lithographic process. Next, the dielectric 700 is etched using the sidewall spacers as an etch mask, thereby forming vias 710, 720 having a widths 715, 725 less than the minimum feature size. The isolation layer and the sacrificial layer can be removed by a planarization process such as CMP, resulting in a structure as illustrated in FIG. 7.

Figure 8A:
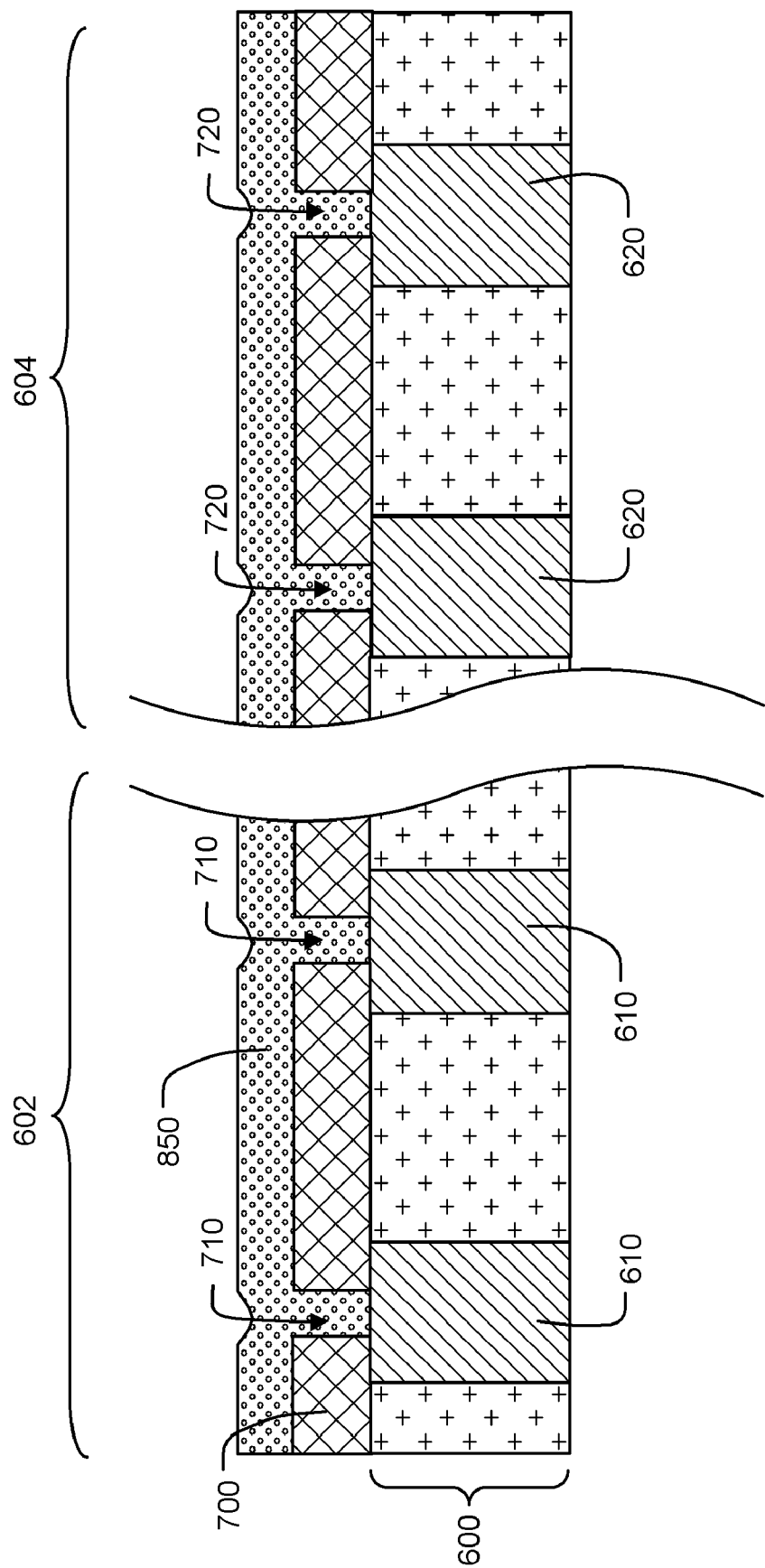

Next, a first phase change material 850 is deposited on the structure illustrated in FIG. 7, resulting in the structure illustrated in FIG. 8A. The first phase change material can be formed within the first and second vias 710, 720, for example, by chemical vapor deposition (CVD). The first phase change material 850 may comprise, for example, any of the materials discussed above. Alternatively, other memory materials may be used in other embodiments of the invention.

Figure 8B:
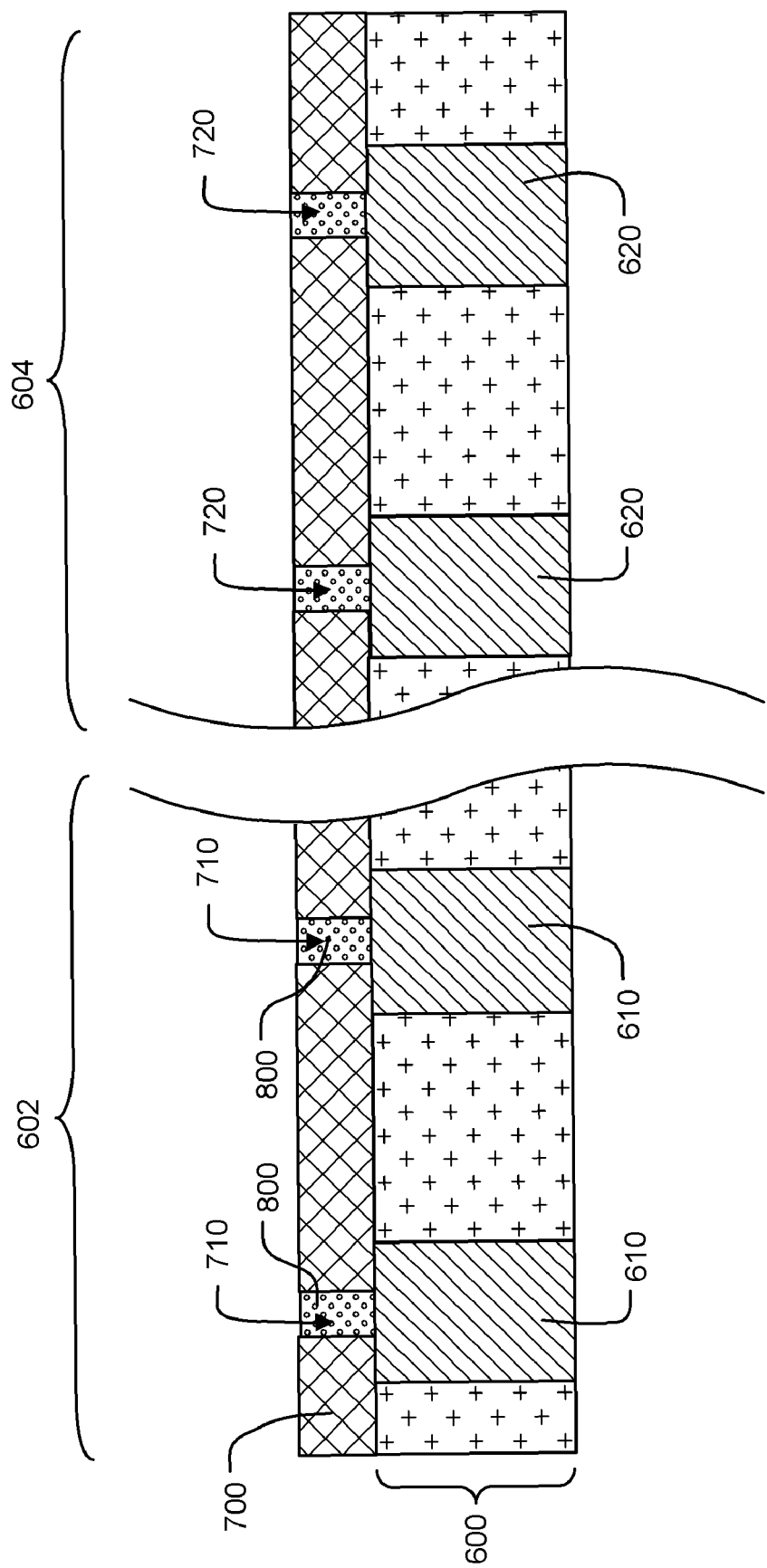

Next, a planarization process is performed on the structure illustrated in FIG. 8A to expose a top surface of the dielectric 700, thereby forming a first set of memory elements 800 comprising the first phase change material within the first set of vias 710 and resulting in the structure illustrated in FIG. 8B. The planarization process may comprise, for example, chemical-mechanical polishing (CMP).

Figure 9:
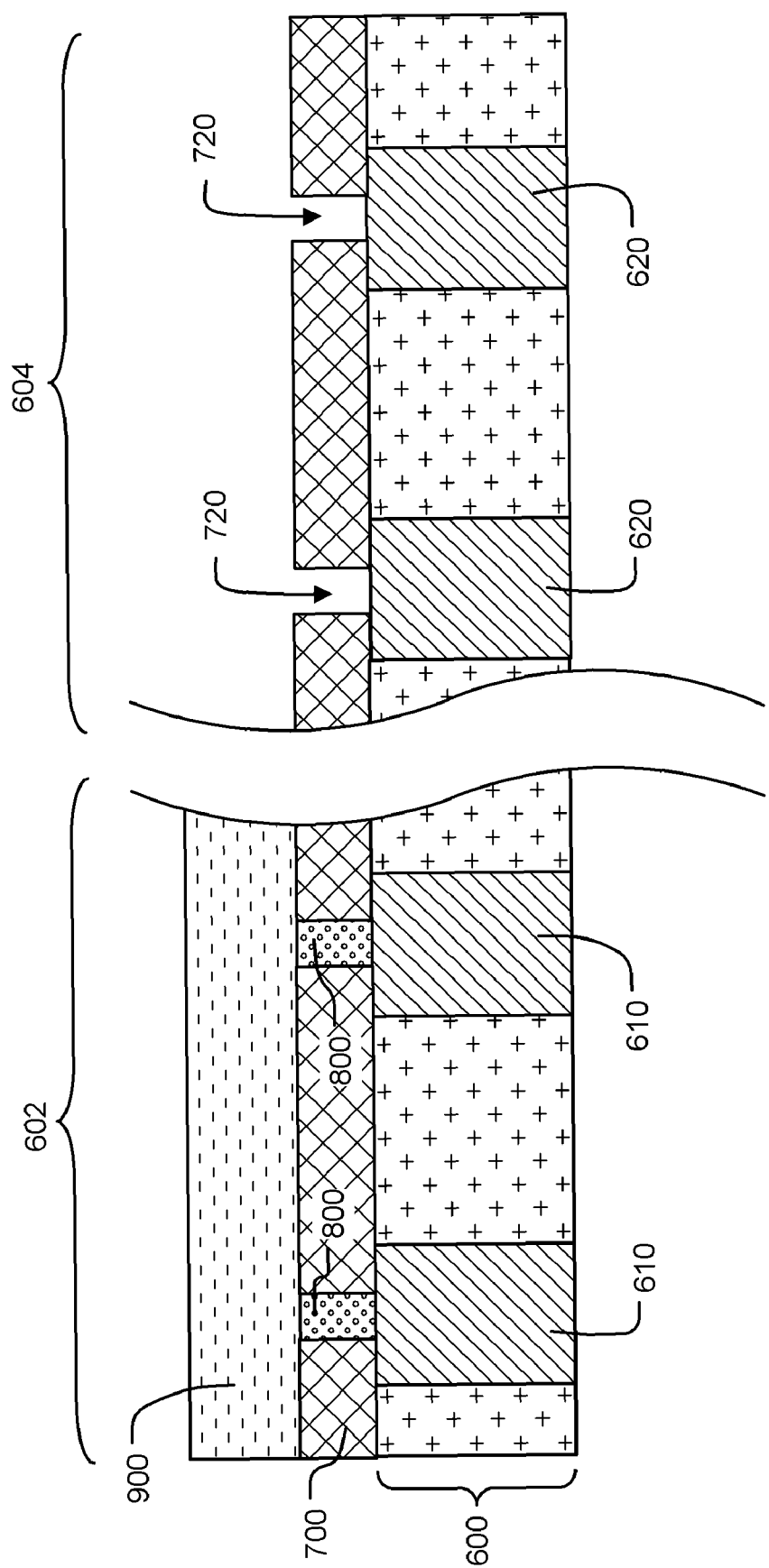

Next, a mask 900 is formed within the region 602 for the first set of memory cells and overlying the first set of memory elements 800 and the first phase change material within the second set of vias 720 is selectively removed, resulting in the structure illustrated in FIG. 9. In the illustrated embodiment the mask 900 comprises a photoresist and the first phase change material within the second set of vias 720 is removed by a selective etching process.

Figure 10A:
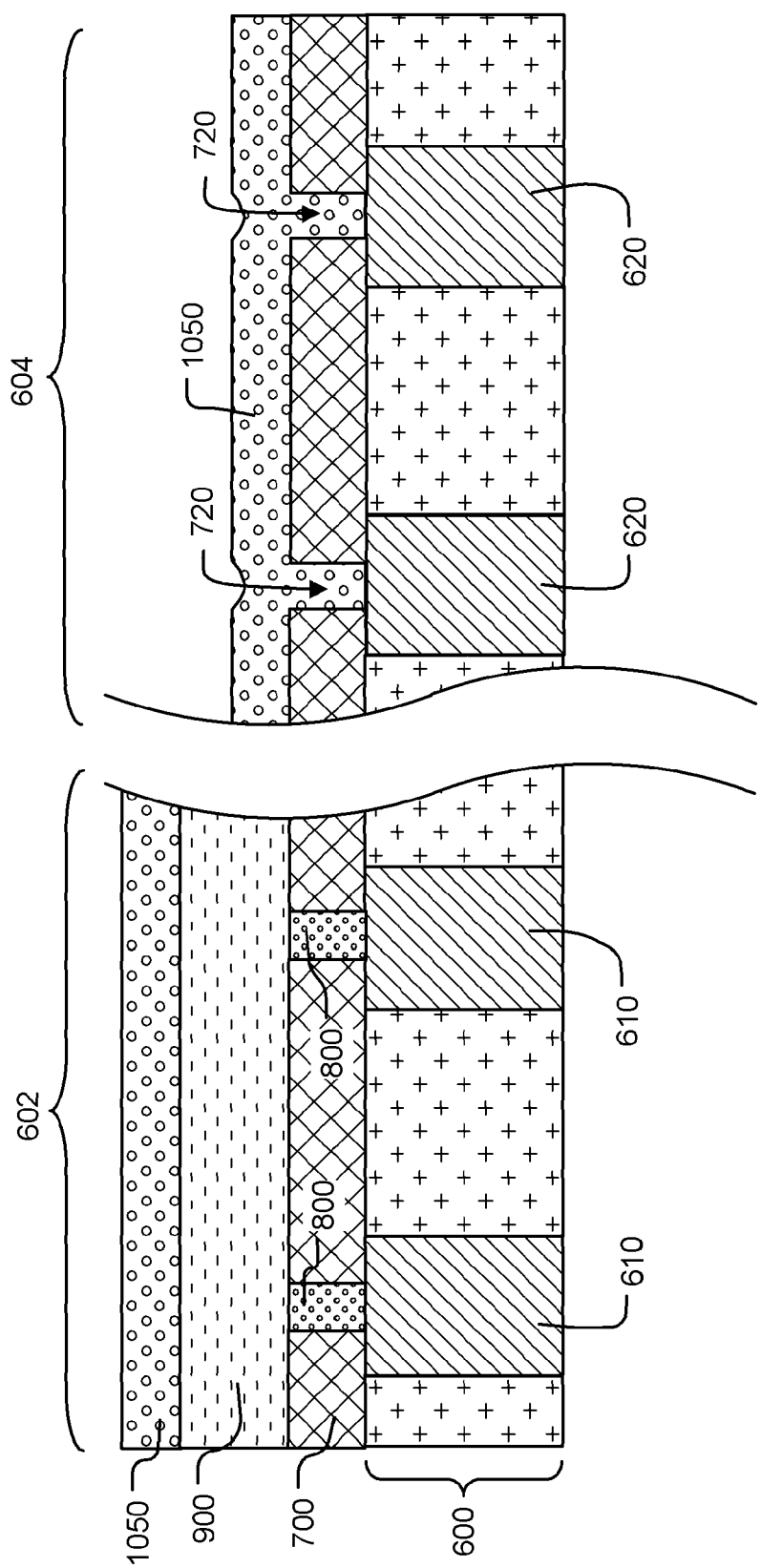

Next, a second phase change material 1050 having different properties than the first phase change material 850 is formed on the structure illustrated in FIG. 9, resulting in the structure illustrated in FIG. 10A. The second phase change material 1050 may be formed, for example, by chemical vapor deposition (CVD). The second phase change material 1050 may comprise, for example, any of the materials discussed above. Alternatively, other programmable resistance memory materials may be used in other embodiments of the invention.

Figure 10B:
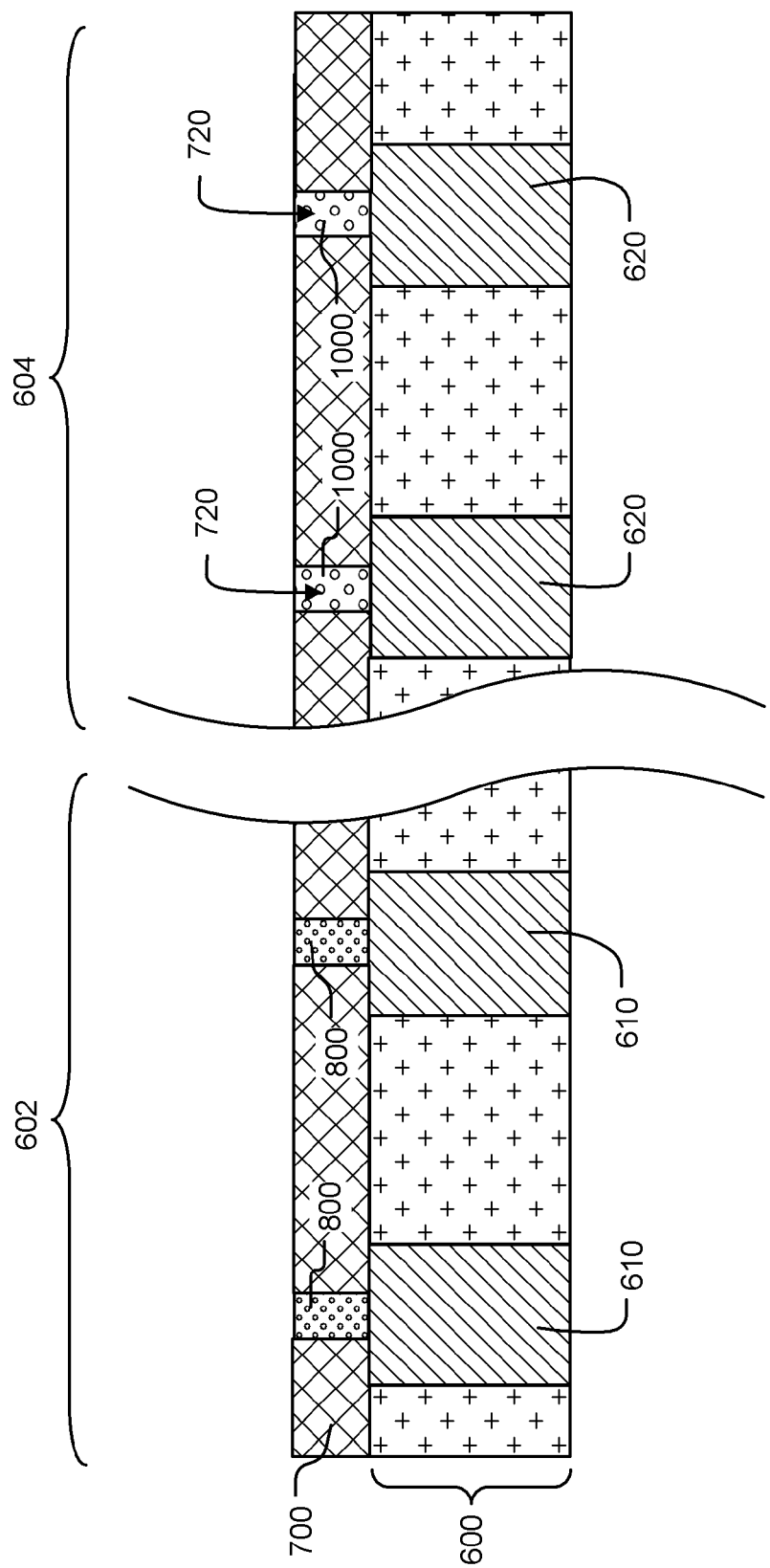

Next, a planarization process is performed on the structure illustrated in FIG. 10A to expose a top surface of the dielectric 700, thereby forming a second set of memory elements 1000 within the second set of vias 720 and resulting in the structure illustrated in FIG. 10B. The planarization process may comprise, for example, chemical-mechanical polishing (CMP).

Figure 11:
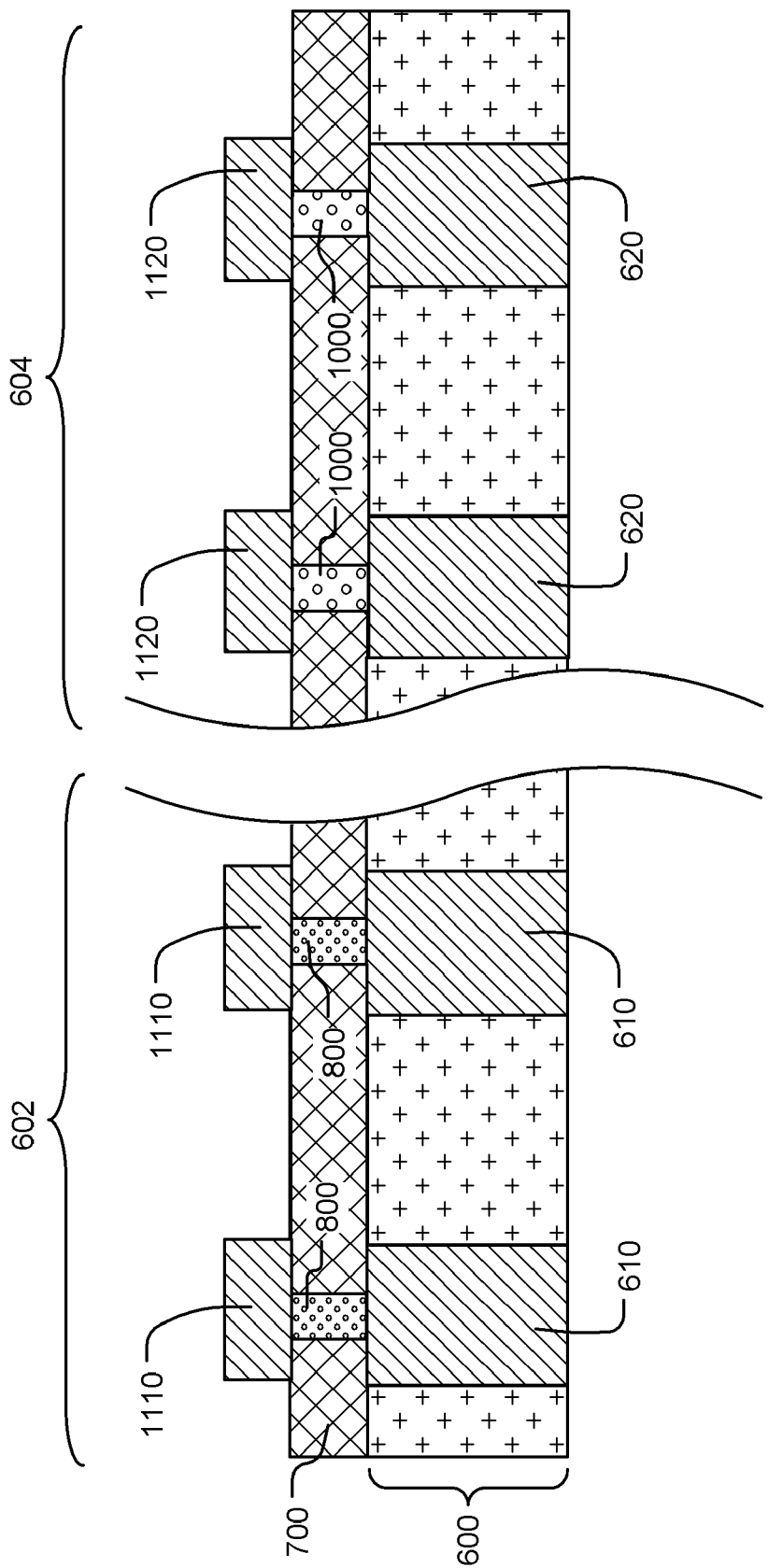

Next, second electrodes 1110, 1120 are formed on the first and second sets of memory elements 800, 1000, resulting in the structure illustrated in FIG. 11. In FIG. 11 the second electrodes 1110, 1120 are formed by patterning a layer of second electrode material on the structure illustrated in FIG. 10B (for example any of the materials discussed above with reference to the first conductive contacts 610, 620).

In FIG. 11 the separate second electrodes 1110, 1120 are formed on the corresponding first and second sets of memory elements 800, 1000. Alternatively, the second electrode material may be patterned into bit lines and thus the second electrodes 1110, 1120 may comprise a portion of a corresponding bit line. In some embodiments in which the regions 602, 604 are arranged in the same array, bit lines may be formed extending between the regions 602, 604 and contacting both the first and second sets of memory elements 800, 1000.

FIGS. 12-15 illustrate an alternative manufacturing embodiment to that illustrated in FIGS. 8-10.

Figure 12A:
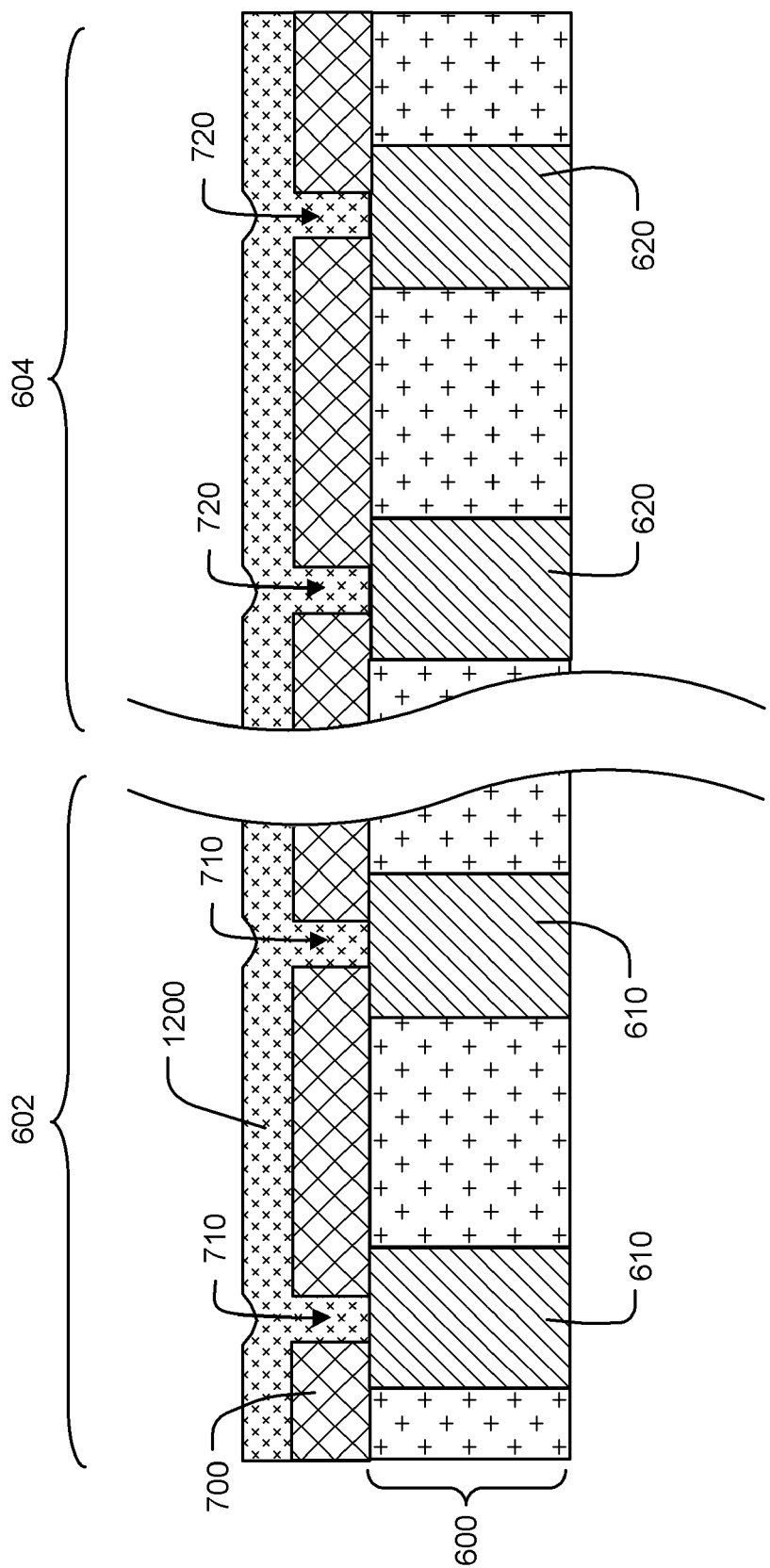
FIGS. 12A-B, 13, 14A-B, 15A-B illustrate an alternative manufacturing embodiment to that illustrated in FIGS. 8-10.

A sacrificial material 1200 is formed on the structure illustrated in FIG. 7, resulting in the structure illustrated in FIG. 12A. The sacrificial material 1200 comprises material that can be selectively processed (e.g. selectively etched) relative to the material of dielectric 700.

Figure 12B:
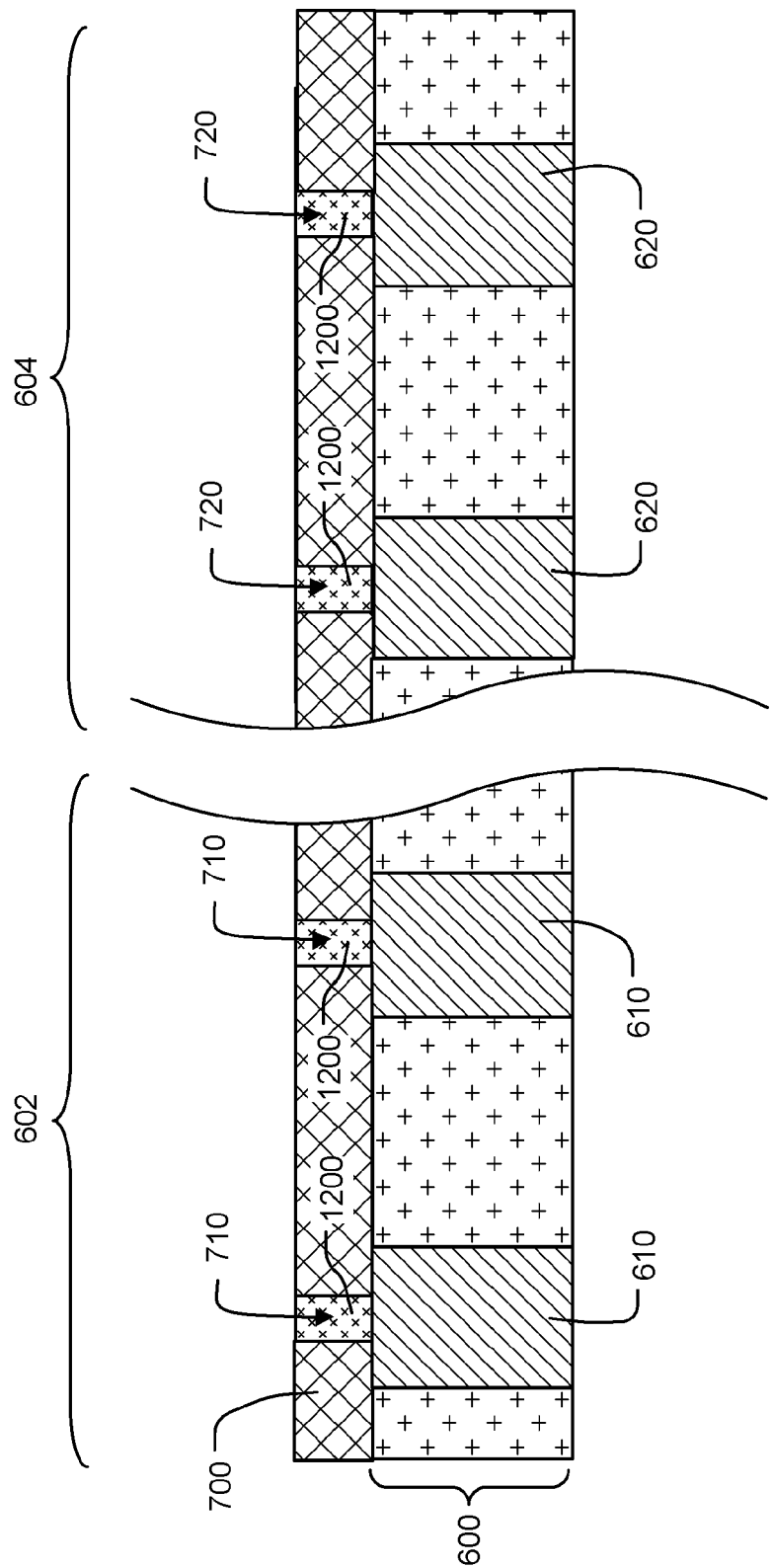

Next, a planarization process such as CMP is performed on the structure illustrated in FIG. 12A to expose a top surface of the dielectric 700, resulting in the structure illustrated in FIG. 12B having sacrificial material within the first and second sets of vias 710, 720.

Figure 13:
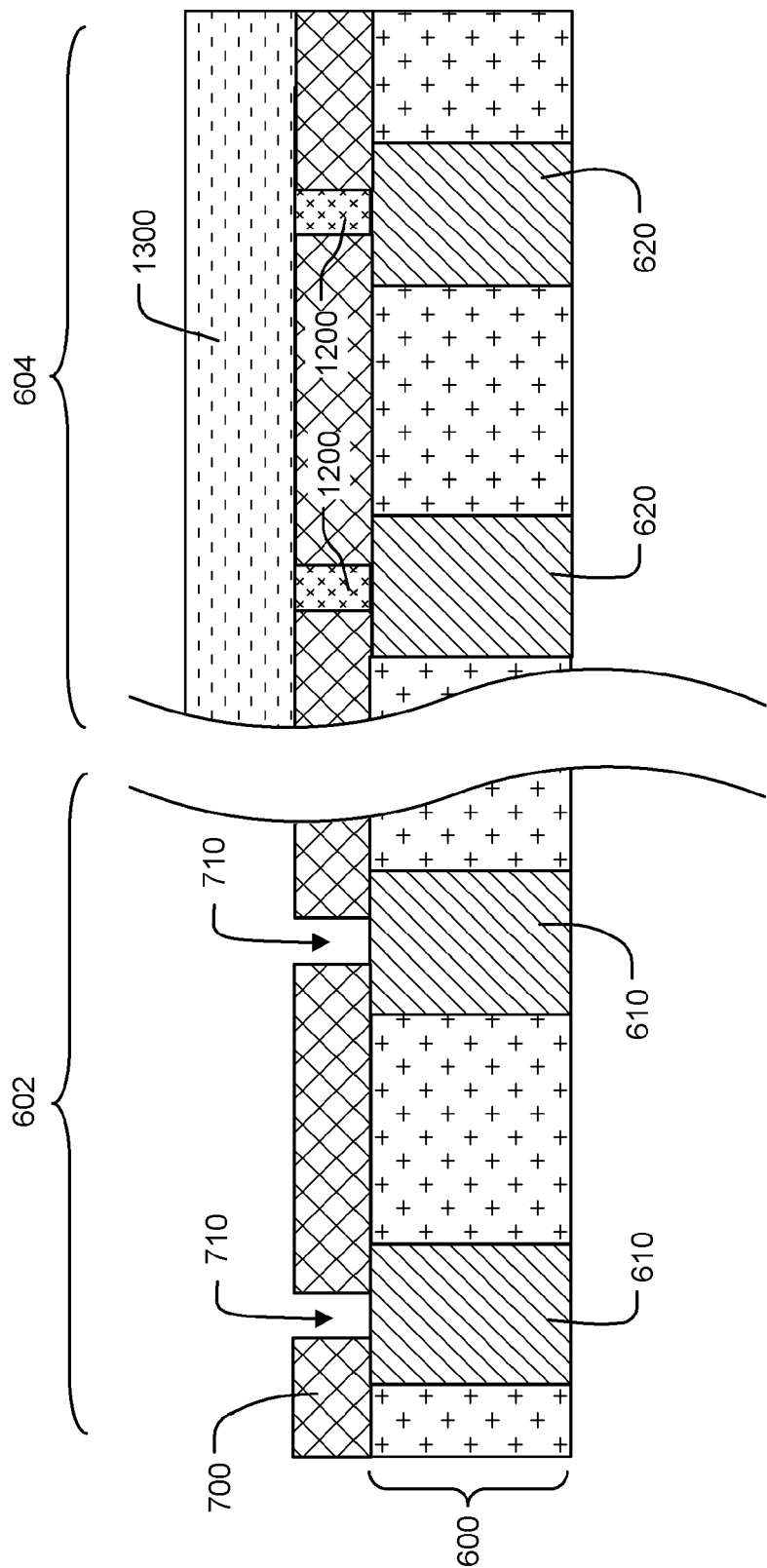

Next, a mask 1300 is formed within the region 604 for the second set of memory cells and overlying the second set of vias 720 and the sacrificial material within the first set of vias 710 is selectively removed, resulting in the structure illustrated in FIG. 13. In the illustrated embodiment the mask 1300 comprises a photoresist and the sacrificial material within the first set of vias 710 is removed by a selective etching process.

Figure 14A:
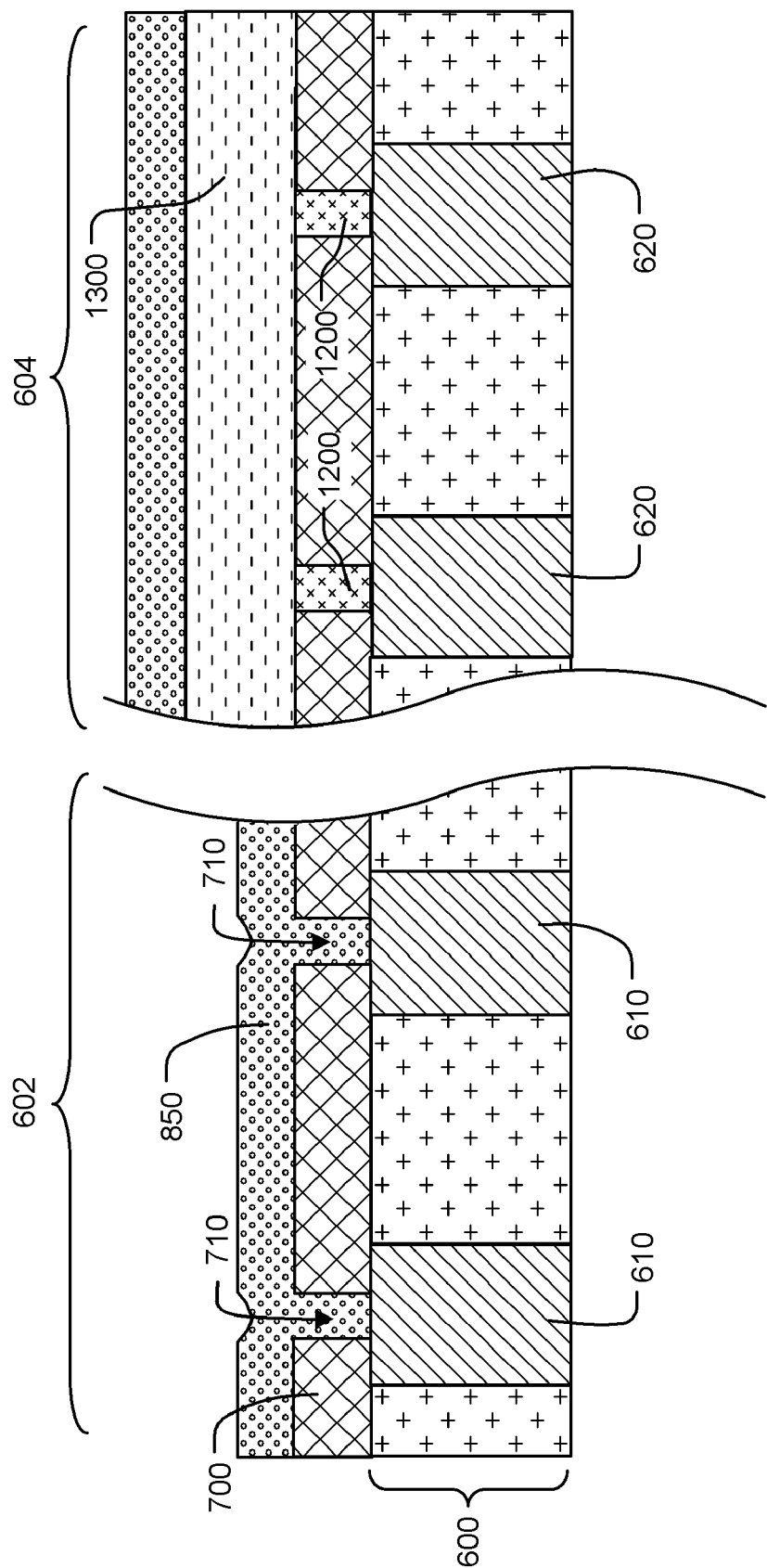

Next, the first phase change material 850 is formed on the structure illustrated in FIG. 13, resulting in the structure illustrated in FIG. 14A. The first phase change material 850 can be formed within the first set of vias 710, for example, by chemical vapor deposition (CVD).

Figure 14B:
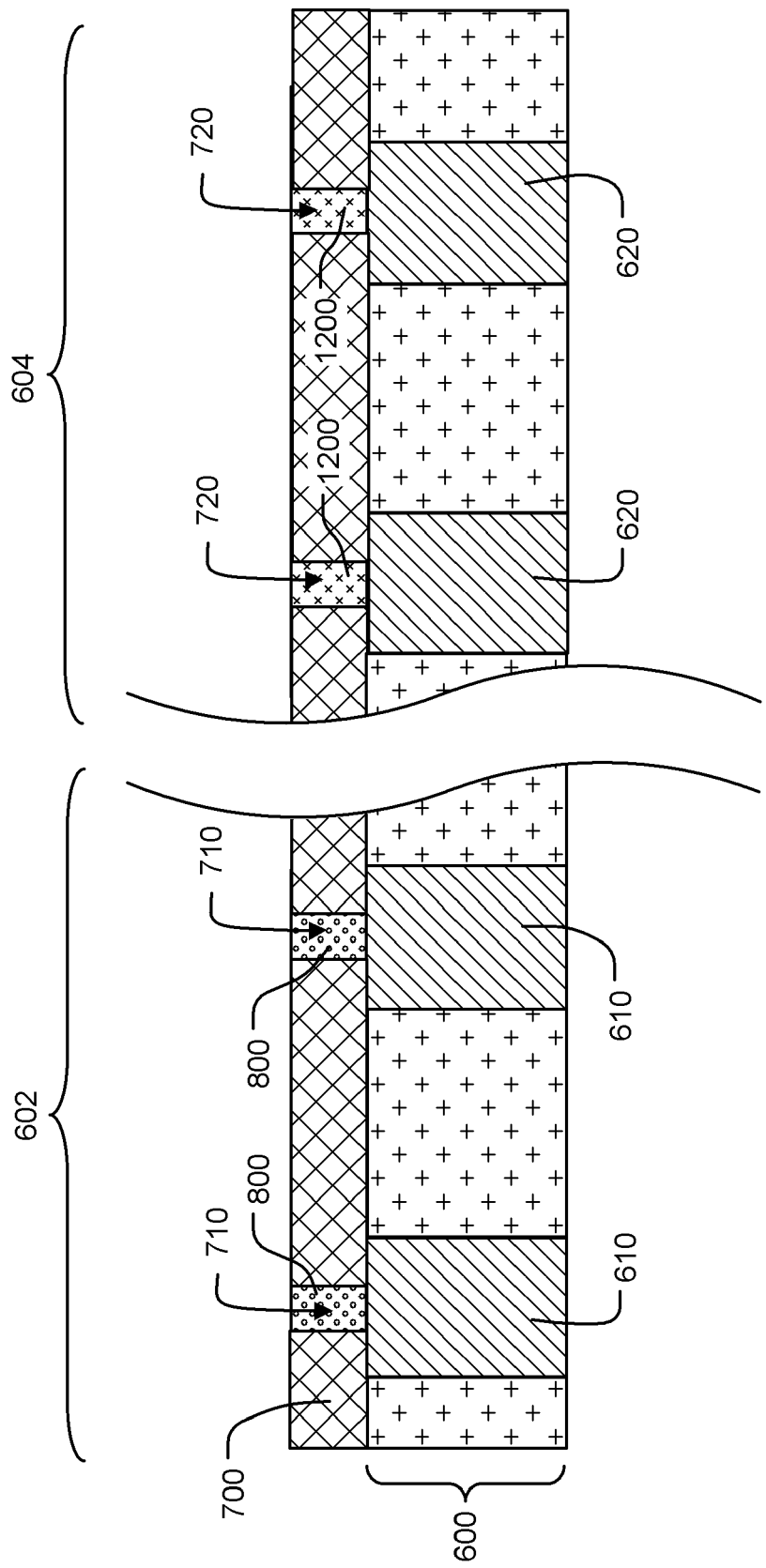

Next, a planarization process is performed on the structure illustrated in FIG. 14A to expose a top surface of the dielectric 700, thereby forming the first set of memory elements 800 comprising the first phase change material 850 within the first set of vias 710 and resulting in the structure illustrated in FIG. 14B. The planarization process may comprise, for example, chemical-mechanical polishing (CMP).

Next, a mask 1500 is formed within the region 602 for the first set of memory cells and overlying the first set of memory elements 800 and the sacrificial material within the second set of vias 720 is selectively removed, resulting in the structure illustrated in FIG. 1A. In the illustrated embodiment the mask 1500 comprises a photoresist and the sacrificial material within the second set of vias 720 is removed by a selective etching process.

Figure 15A:
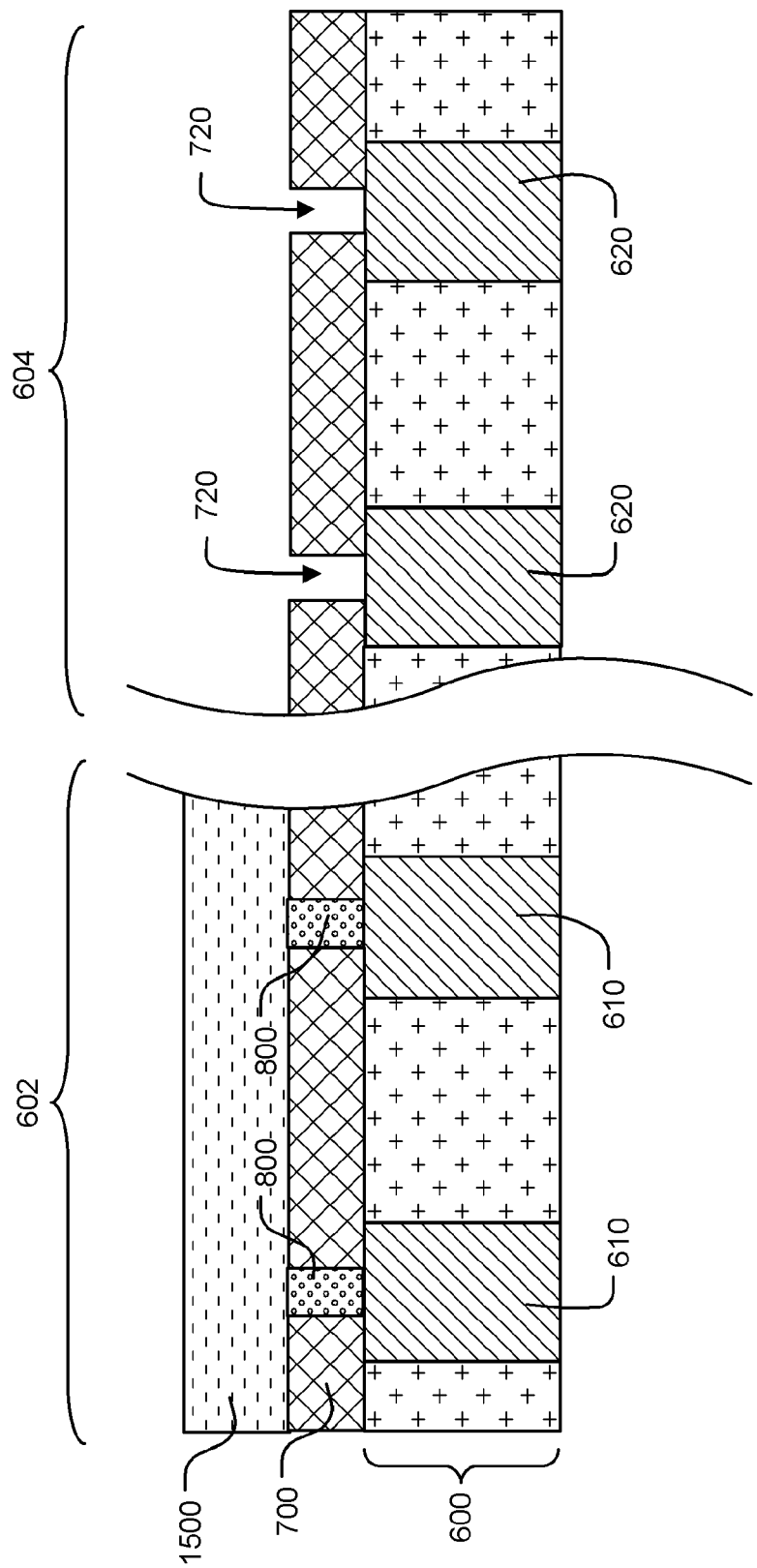
Figure 15B:
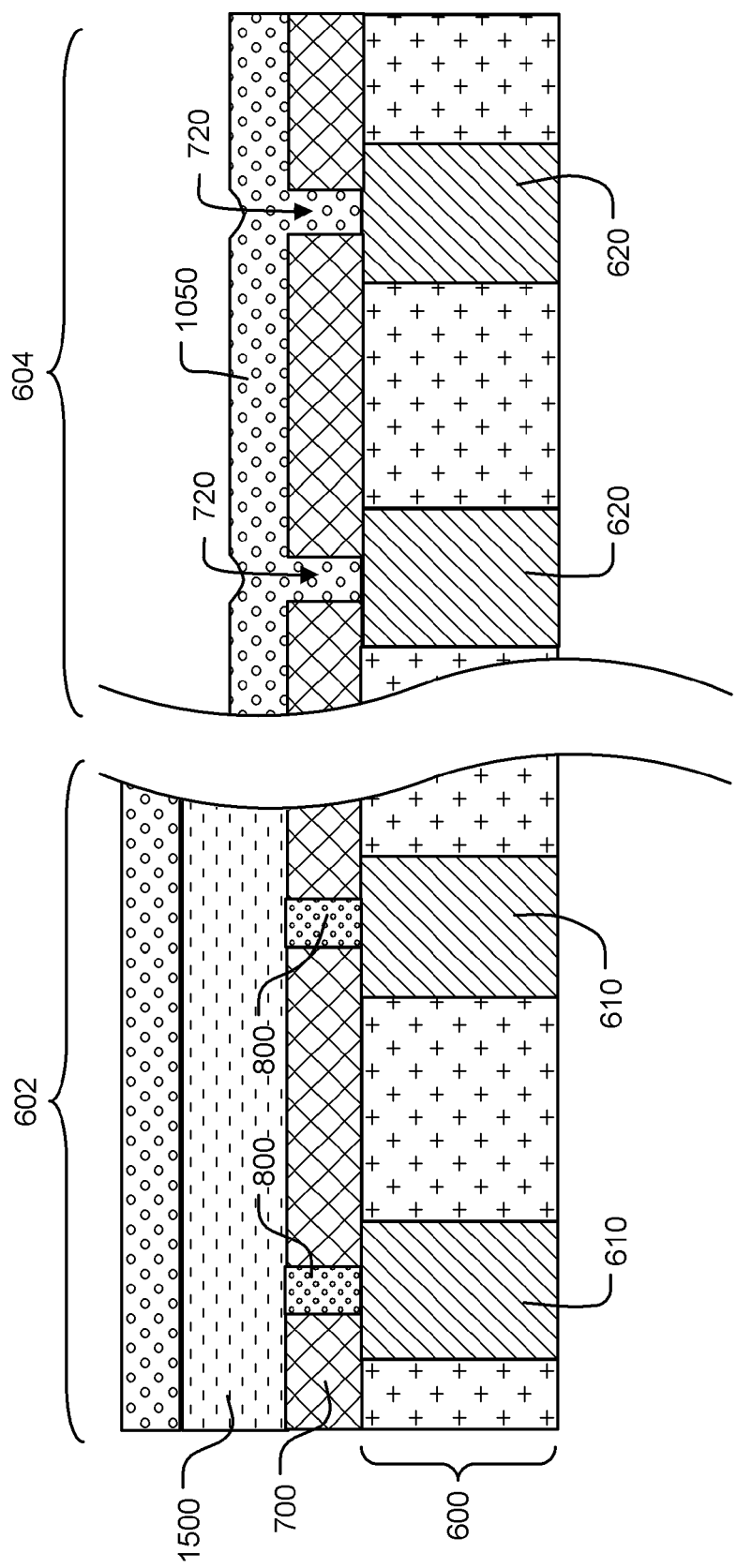

Next, the second phase change material 1050 is formed on the structure illustrated in FIG. 15A, resulting in the structure illustrated in FIG. 15B.

Next, a planarization process is performed on the structure illustrated in FIG. 15B to expose a top surface of the dielectric 700, thereby forming a second set of memory elements 1000 within the second set of vias 720 and resulting in the structure illustrated in FIG. 10B. The planarization process may comprise, for example, chemical-mechanical polishing (CMP).

FIGS. 16-19 illustrate an alternative manufacturing embodiment to that illustrated in FIGS. 7-10.

Figure 16:
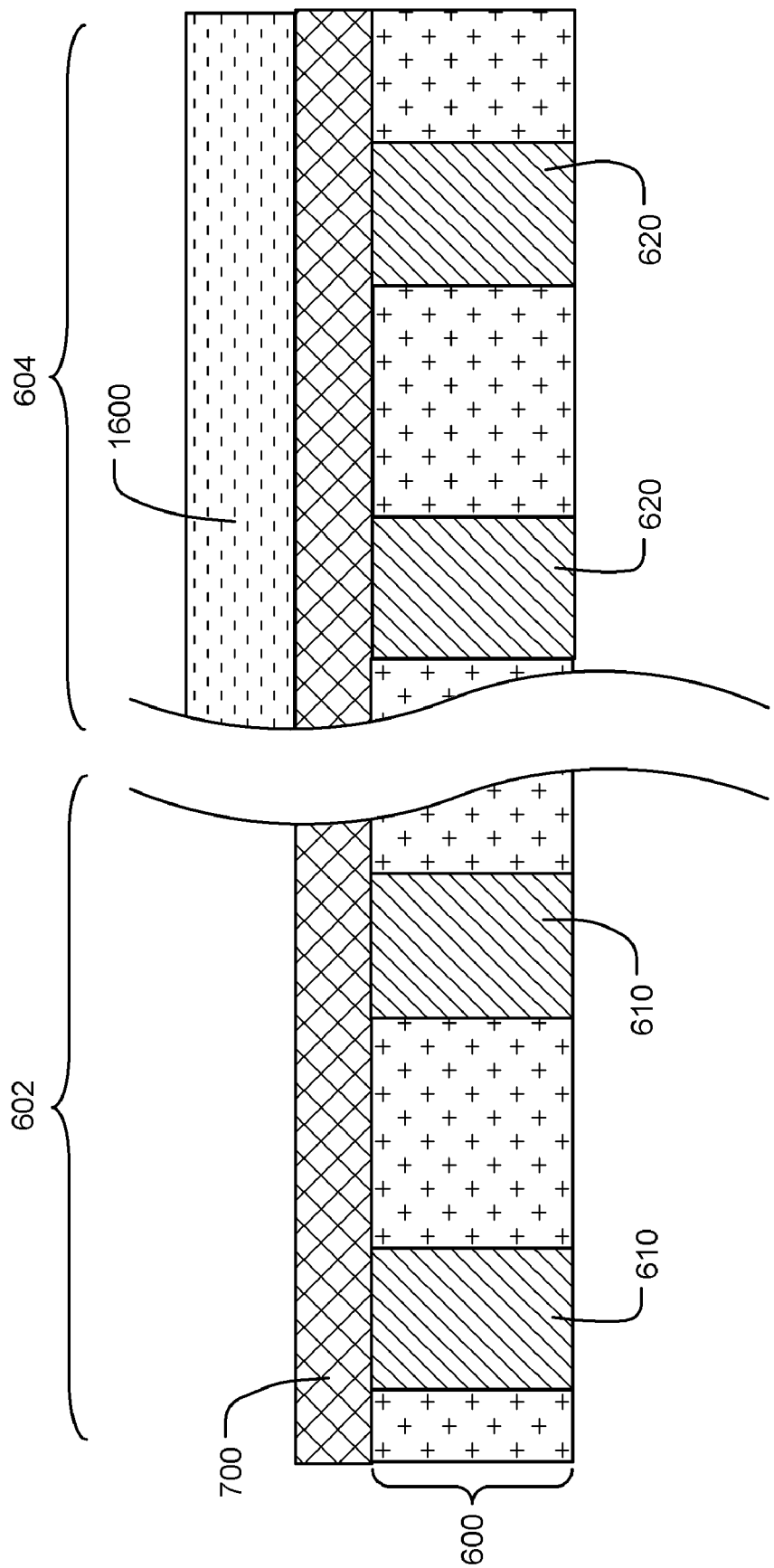
FIGS. 16-17, 18A-B, 19 illustrate an alternative manufacturing embodiment to that illustrated in FIGS. 7-10.

Dielectric 700 is formed on the top surface 601 of the memory access layer 600 of FIG. 6, and a mask 1600 is formed within the region 604 for the second set of memory cells and overlying the second set of contacts 620, resulting in the structure illustrated in FIG. 16.

Figure 17:
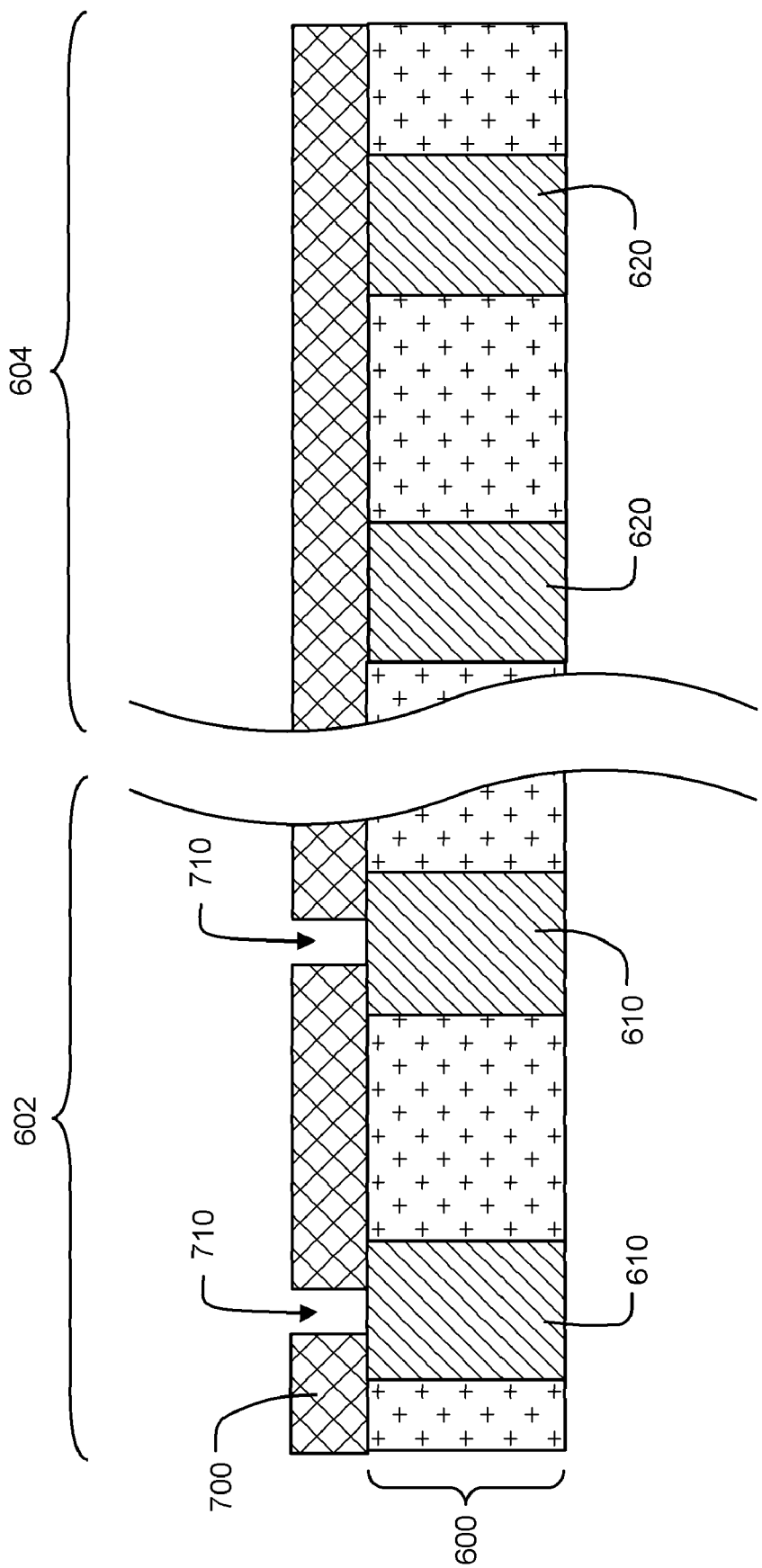

Next, the first set of vias 710 are formed through the dielectric 700 to expose top surfaces of the first set of conductive contacts 610 and the mask 1600 is removed, resulting in the structure illustrated in FIG. 17.

Figure 18A:
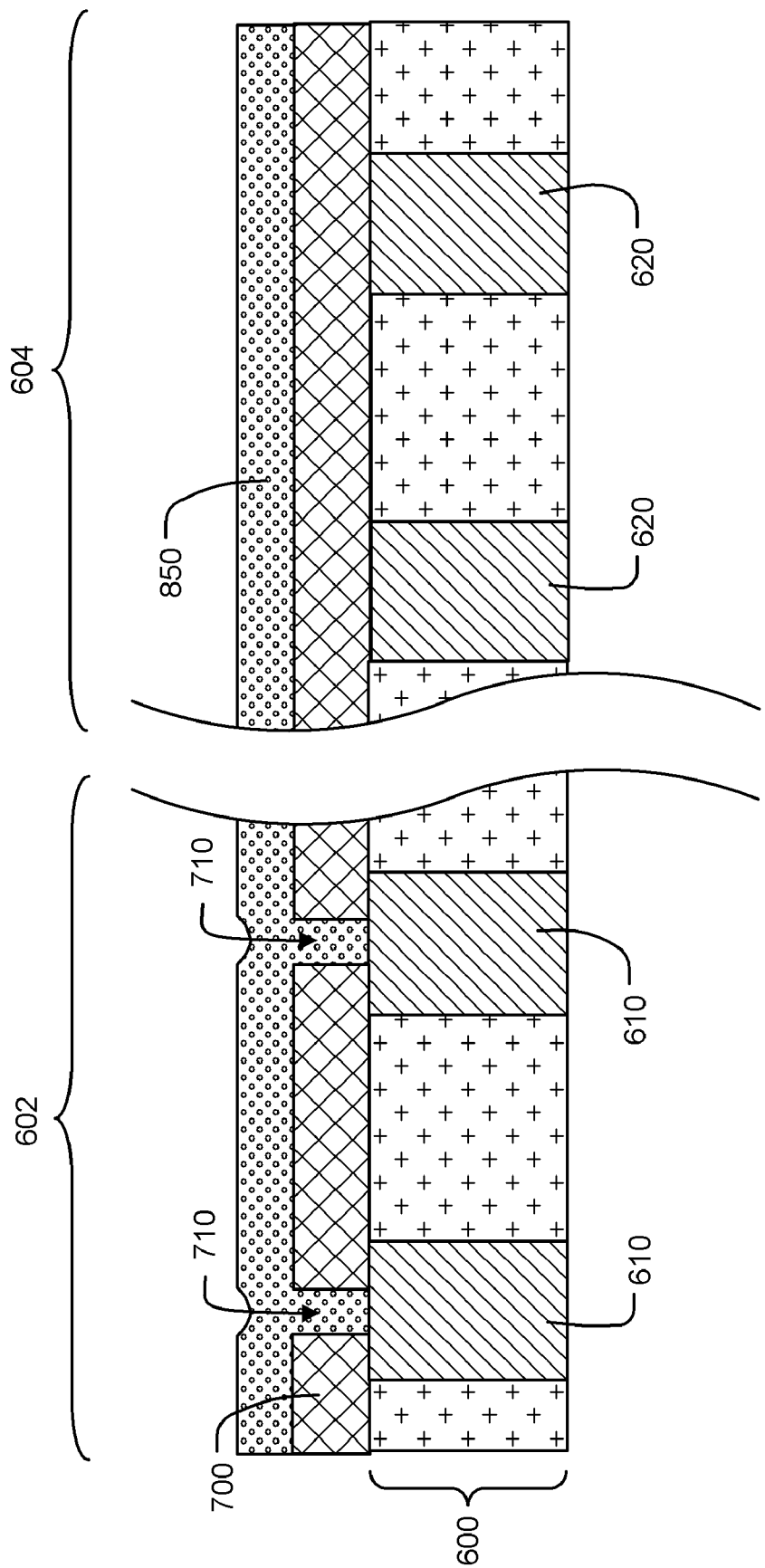

Next, the first phase change material 850 is formed on the structure illustrated in FIG. 17, resulting in the structure illustrated in FIG. 18A. The first phase change material 850 can be formed within the first set of vias 710, for example, by chemical vapor deposition (CVD).

Figure 18B:
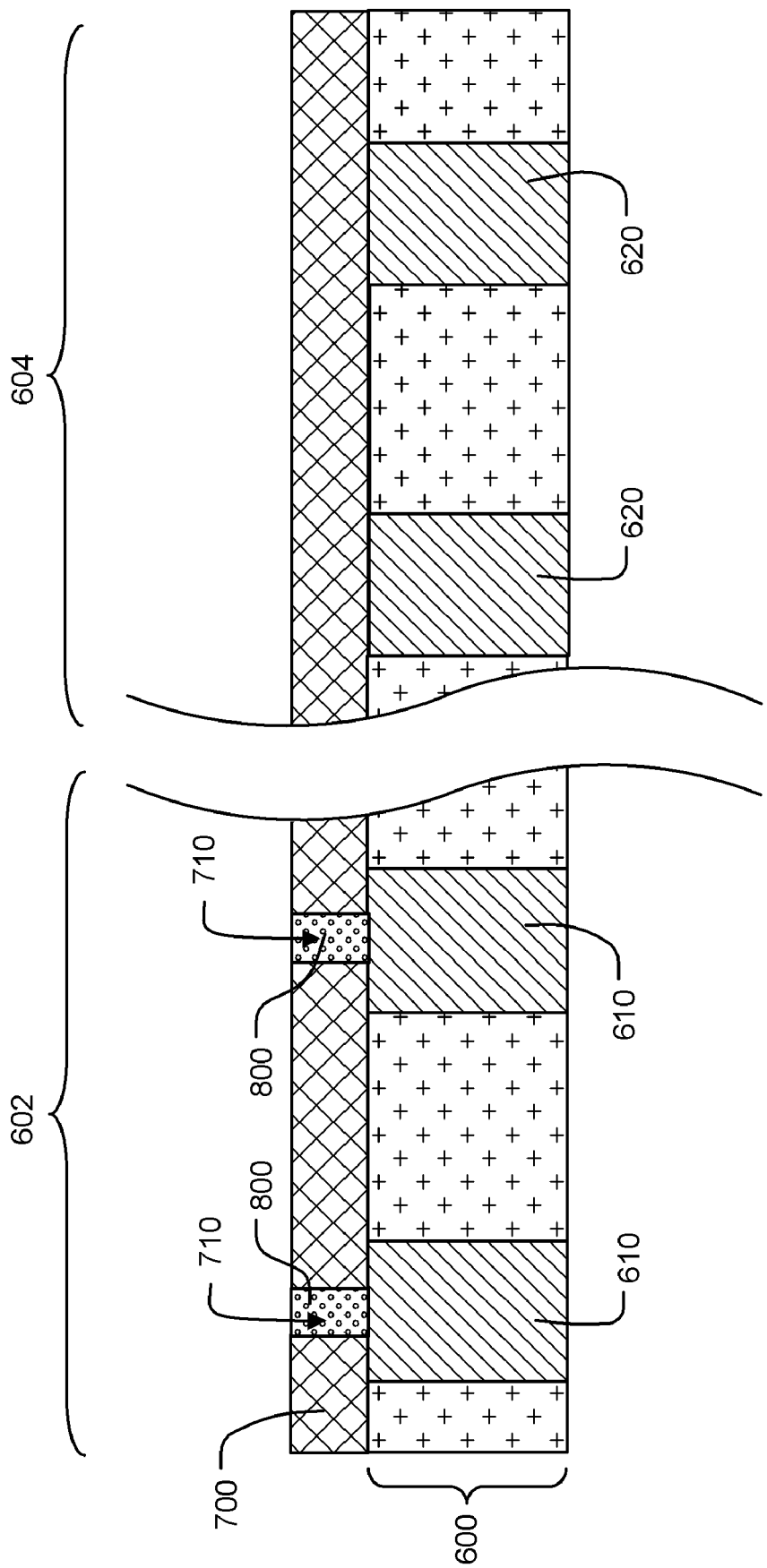

Next, a planarization process is performed on the structure illustrated in FIG. 18A to expose a top surface of the dielectric 700, thereby forming the first set of memory elements 800 comprising the first phase change material 850 within the first set of vias 710 and resulting in the structure illustrated in FIG. 18B. The planarization process may comprise, for example, chemical-mechanical polishing (CMP).

Figure 19:
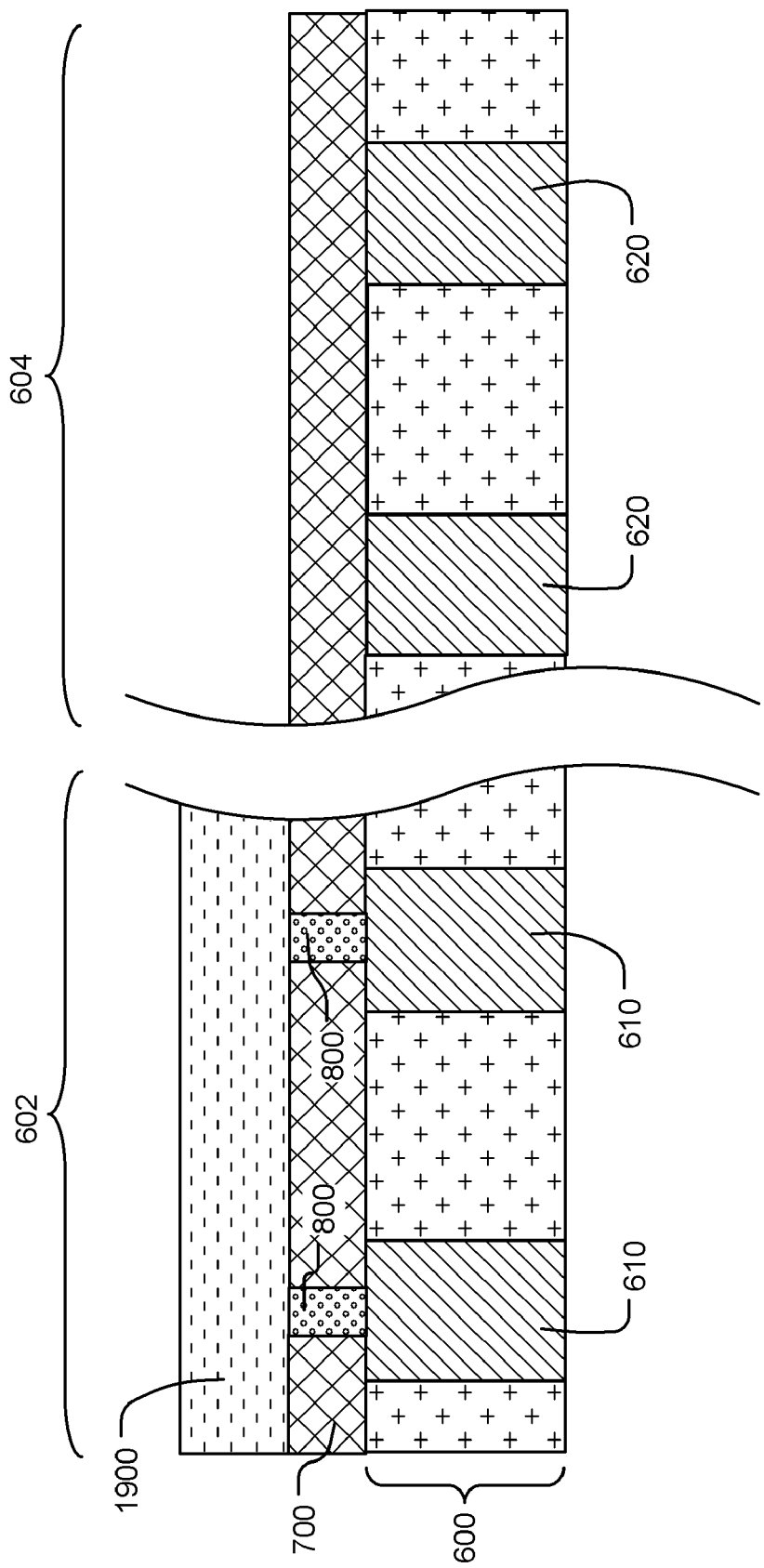

Next, a mask 1900 is formed within the region 602 for the first set of memory cells and overlying the first set of memory elements 800, resulting in the structure illustrated in FIG. 19.

Next, the second set of vias 720 are formed through the dielectric 700 to expose top surfaces of the second set of contacts 620, the second phase change material is formed within the second set of vias 720 and the mask 1900 is removed, thereby forming the second set of memory elements 1000 within the second set of vias 720 and resulting in the structure illustrated in FIG. 10B. The second phase change material can be formed within the second set of vias 720, for example, by chemical vapor deposition (CVD) of the second phase change material followed by a planarization process such as chemical-mechanical polishing (CMP) to expose a top surface of the dielectric 700.

FIGS. 20-25 illustrate steps in a fabrication sequence for manufacturing first and second sets of memory cells comprising first and second phase change materials as described herein.

Figure 20:
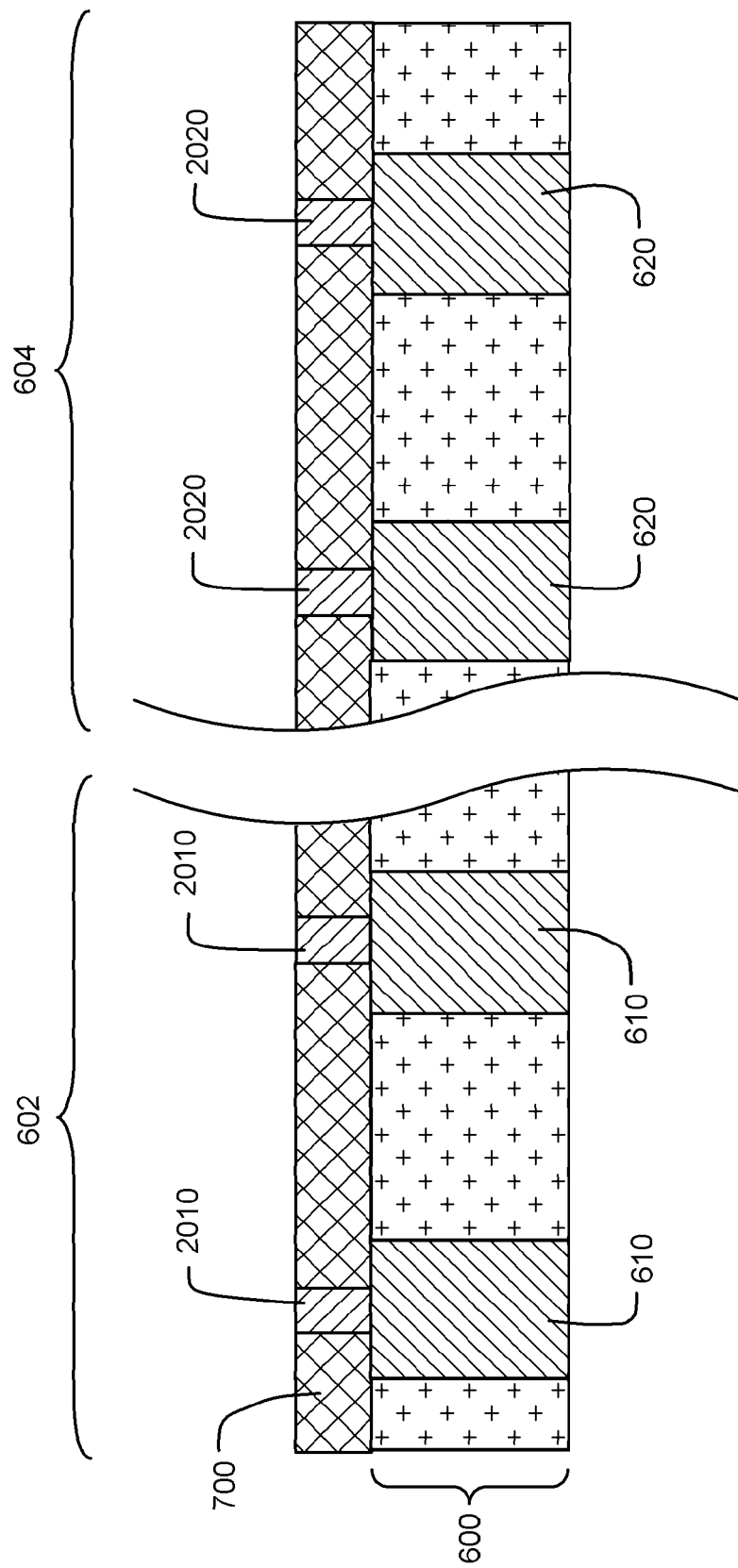
FIGS. 20-25 illustrate steps in a fabrication sequence for manufacturing first and second sets of memory cells comprising first and second phase change materials as described herein.

First and second sets of bottom electrodes 2010, 2020 are formed within the first and second sets of vias 710, 720 of FIG. 7, resulting in the structure illustrated in FIG. 20. The first and second sets of bottom electrodes 2010, 2020 can be formed by depositing electrode material on the structure illustrated in FIG. 7, followed by a planarization process such as CMP to expose a top surface of dielectric 700. The first and second sets of bottom electrodes 2010, 2020 may comprise, for example, materials and combinations discussed above with reference to conductive contacts 610, 620.

As was described above with reference to FIG. 7, the vias 710, 720 can be formed for example, using methods, materials, and processes as disclosed in U.S. patent application Ser. No. 11/855,979 filed 14 Sep. 2007 entitled "Phase Change Memory Cell in Via Array with Self-Aligned, Self-Converged Bottom Electrode and Method for Manufacturing". In such an embodiment the isolation layer and the sacrificial layer can be removed by a planarization process prior to the deposition of the electrode material on the structure of FIG. 7. Alternatively, the electrode material may be deposited within the vias 710, 720 and overlying the isolation layer and the sacrificial layer, followed by a planarization process such as CMP to remove the isolation layer and the sacrificial layer and result in the structure illustrated in FIG. 20.

In other alternative embodiments, the bottom electrodes 2010, 2020 having sublithographic widths and the dielectric 700 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode", which is incorporated by reference herein. For example, a layer of electrode material can be formed on the top surface 601 of memory access layer 600, followed by patterning of a layer of photoresist on the electrode layer using standard photo lithographic techniques so as to form a mask of photoresist overlying the locations of the bottom electrodes 2010, 2020. Next the mask of photoresist is trimmed, using for example oxygen plasma, to form mask structures having sublithographic dimensions overlying the locations of the bottom electrodes 2010, 2020. Then the layer of electrode material is etched using the trimmed mask of photoresist, thereby forming the bottom electrodes 2010, 2020 having sublithographic widths. Next dielectric material 700 is formed and planarized, resulting in the structure illustrated in FIG. 20.

Figure 21:
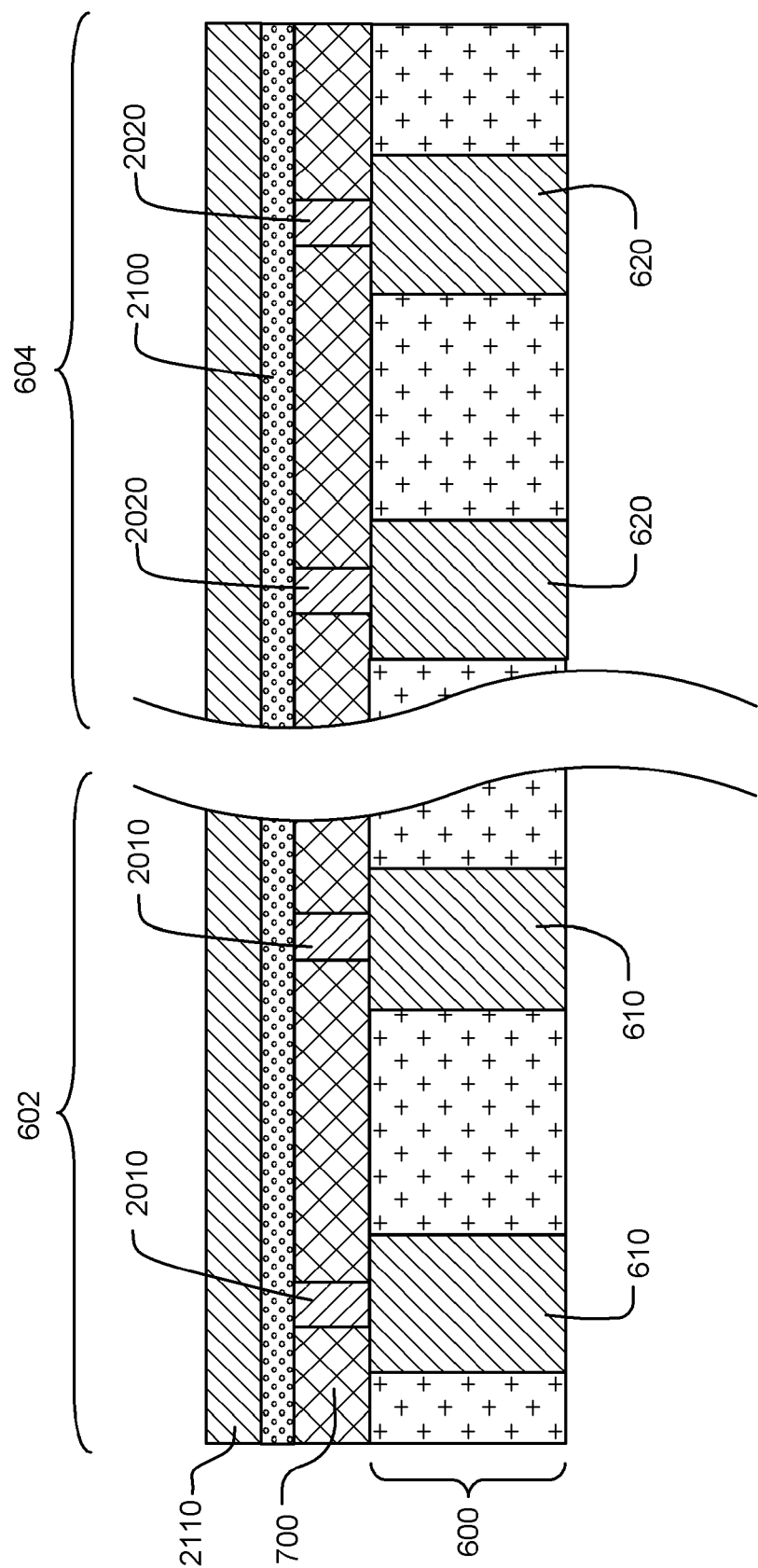

Next, a first phase change material 2100 is formed on the structure illustrated in FIG. 7 and a first top electrode material 2110 is formed on the first phase change material 2100, resulting in the structure illustrated in FIG. 21.

Figure 22:
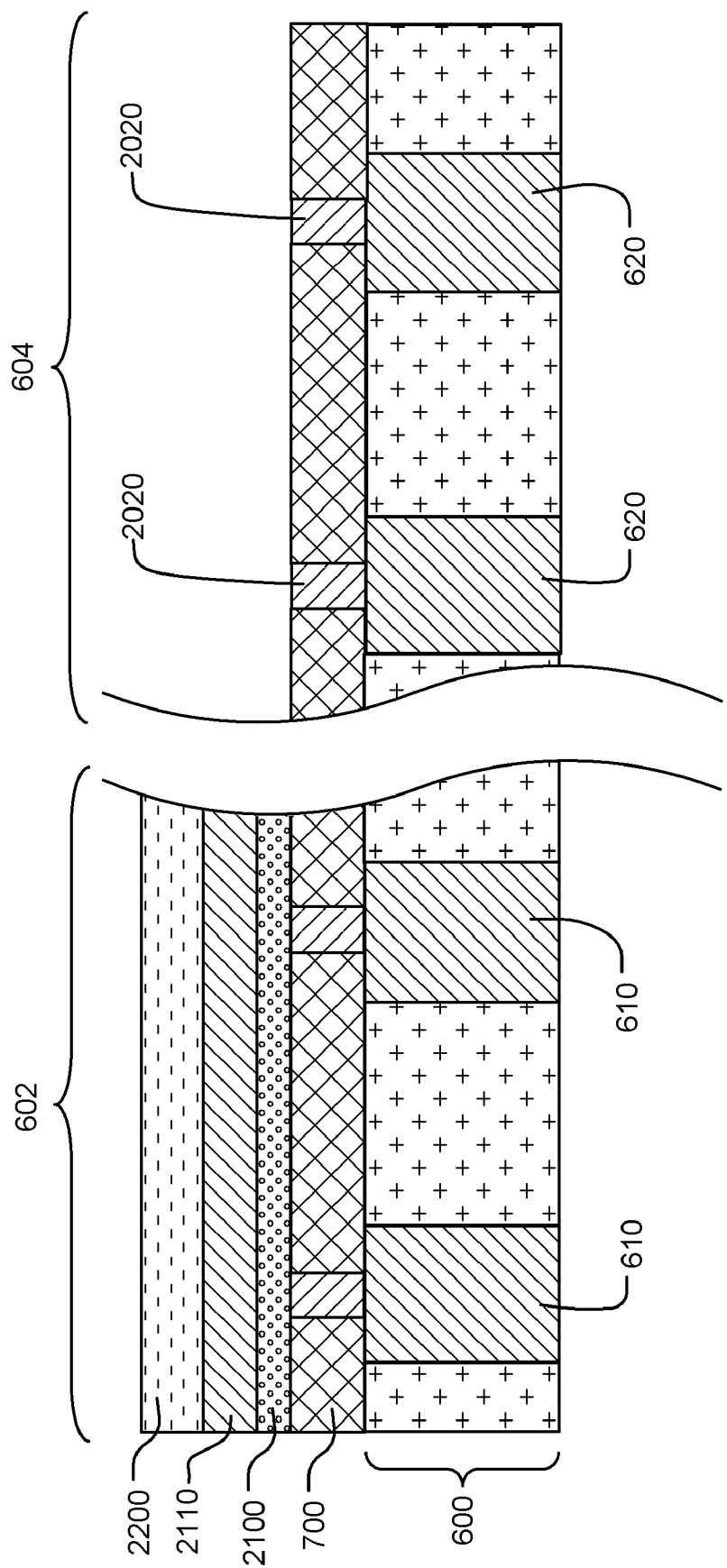

Next, a mask 2200 is formed within the region 602 for the first set of memory cells and overlying the first set of bottom electrodes 2010 and the first phase change material 2100 and first top electrode material 2110 within the region 604 of the second set of memory cells is removed, resulting in the structure illustrated in FIG. 22.

Figure 23:
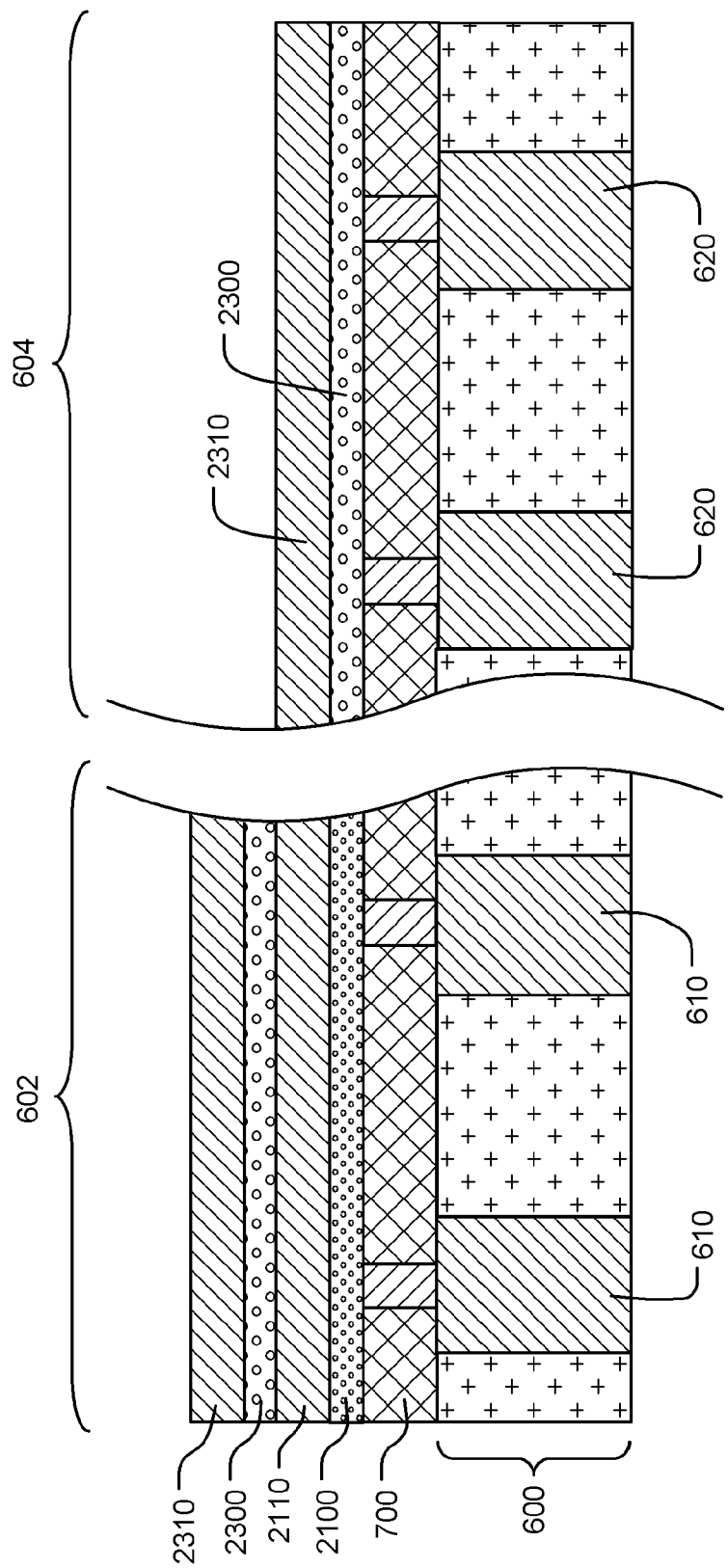

The mask 2200 is then removed, a second phase change material 2300 is formed on the structure illustrated in FIG. 22, and a second top electrode material 2310 is formed on the second phase change material 2300, resulting in the structure illustrated in FIG. 23.

Figure 24:
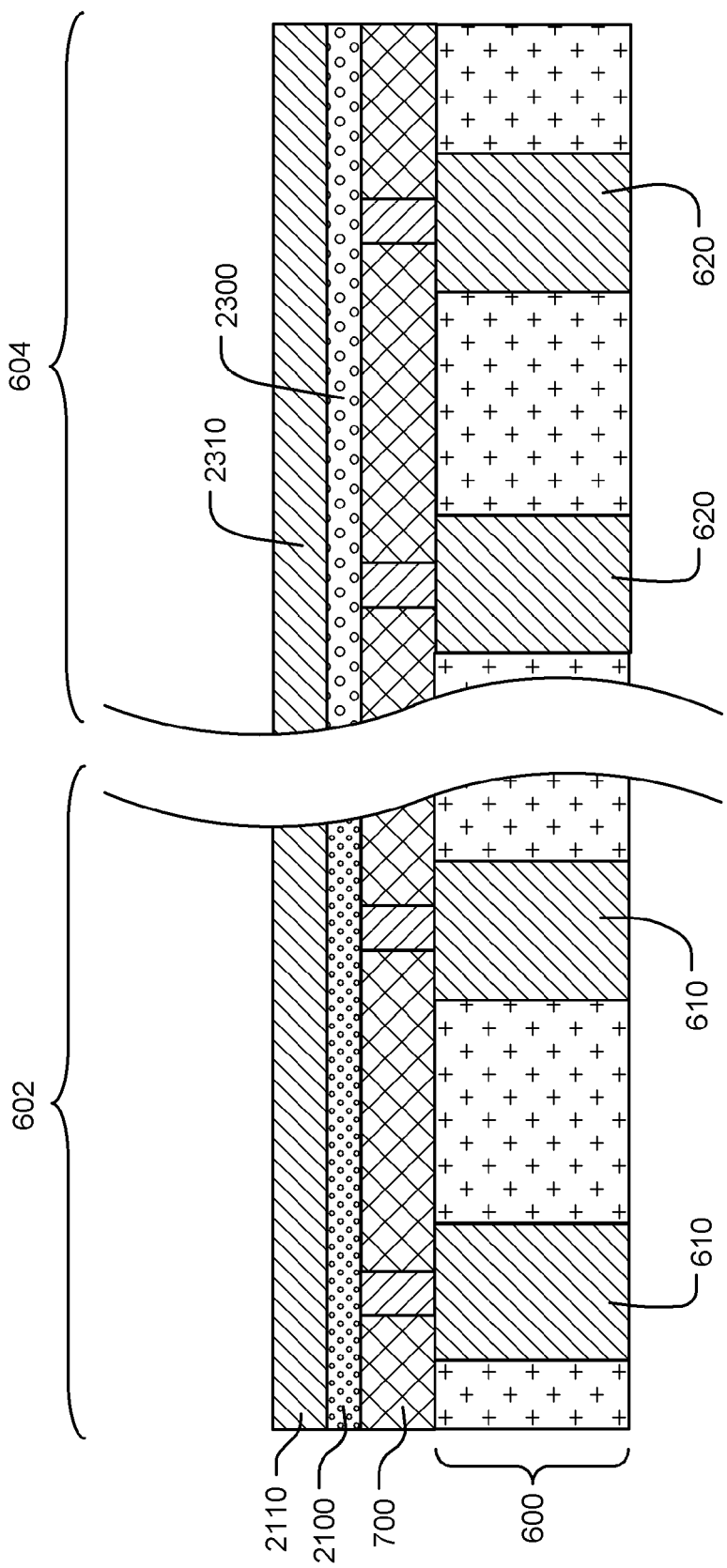

Next, the second phase change material 2300 within the region 602, and the second top electrode material 2310 within the region 602 are removed to expose a top surface of the first top electrode material 2110 within the region 602, resulting in the structure illustrated in FIG. 24. The second phase change material 2300 and the second top electrode material 2310 within the region 602 can be removed, for example, by forming a mask such as photoresist within the region 604, and selectively etching through the second phase change material 2300 to expose a top surface of the first top electrode material 2110 within the region 602.

Figure 25:
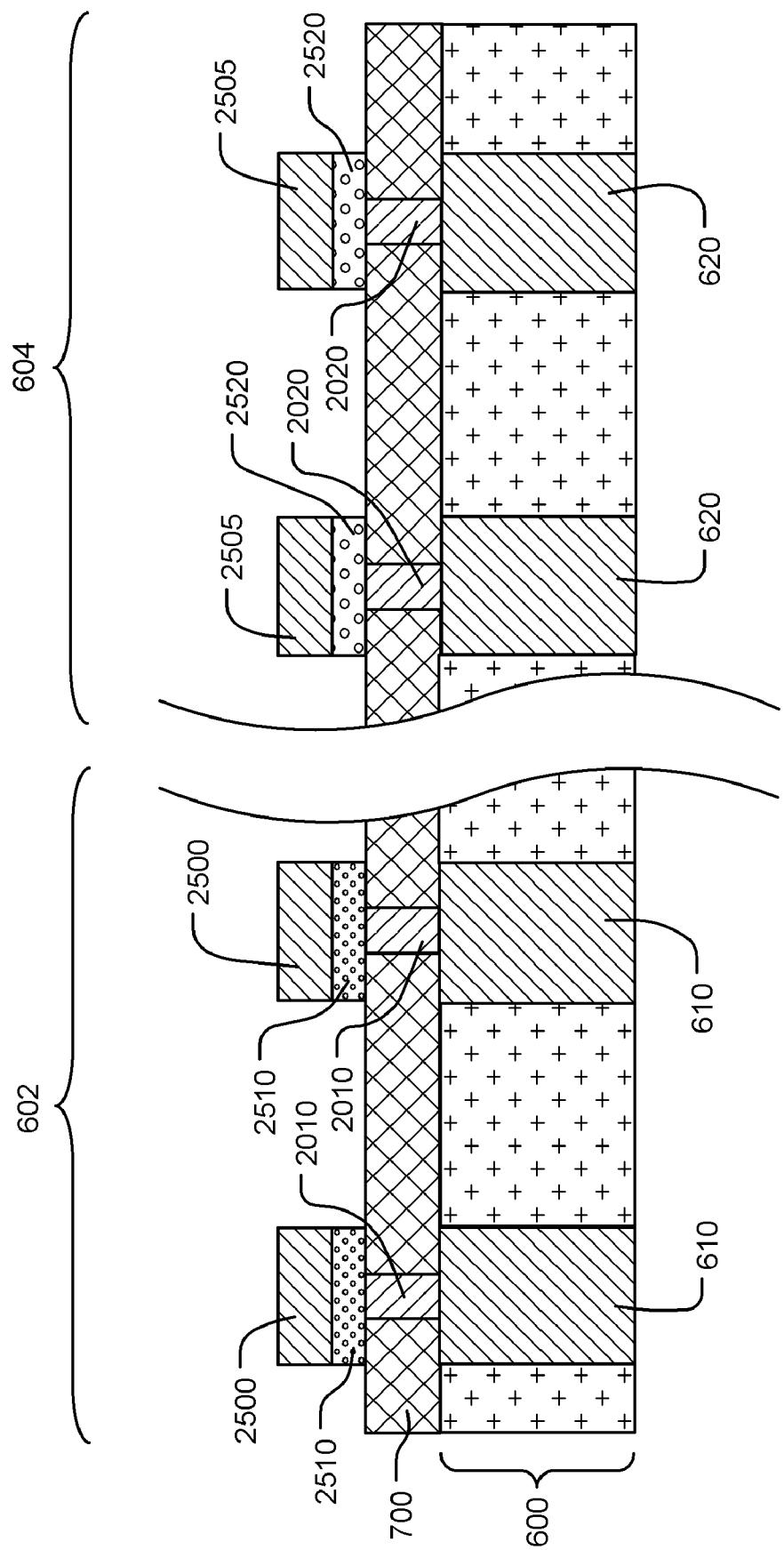

Next, the top electrode materials 2110, 2310 and the first and second phase change materials 2100, 2300 are patterned, resulting in second electrodes 2500, 2505 and first and second sets of memory elements 2510, 2520 as illustrated in FIG. 25.

In FIG. 25 the separate second electrodes 2500, 2505 are formed on the corresponding first and second sets of memory elements 2510, 2520. Alternatively, the top electrode materials 2110, 2310 and the first and second phase change materials 2100, 2300 may be patterned into bit lines and strips of memory material, and thus the second electrodes 2110, 2310 may comprise a portion of a corresponding bit line and the first and second sets of memory elements 2510, 2520 may comprise a portion of a strip of memory material. In some embodiments in which the regions 602, 604 are arranged in the same array, bit lines and strips of memory material may be formed extending between the regions 602, 604 and contacting both the first and second sets of bottom electrodes 2010, 2020.

Any and all patents, patent applications and print publications referred to above are incorporated by reference.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a first set of memory cells;
   a second set of memory cells, the first and second sets of memory cells having different physical configurations such that the first and second sets of memory cells have different operational memory characteristics;
   bias circuitry adapted to apply pulses to control the plurality of memory cells, the pulses including:
   a first pulse applied to program a memory cell in the first set of memory cells to one of first and second states; and
   a second pulse applied to program a memory cell in the second set of memory cells to one of first and second states, the first and second pulses having different values for at least one of pulse width and pulse height.

2. The memory device of claim 1, wherein the first and second sets of memory cells are arranged in an array, the first set of memory cells at a first location in the array, the second set of memory cells at a second location in the array.

3. The memory device of claim 1, wherein:
   the first set of memory cells is arranged in a first array at a first location on the substrate; and
   the second set of memory cells is arranged in a second array at a second location on the substrate and spaced away from the first array.

4. The memory device of claim 1, wherein the first and second sets of memory cells comprise memory elements having the same physical configuration.

5. The memory device of claim 1, wherein the first and second sets of memory cells comprise memory elements having different physical configurations.

6. The memory device of claim 1, wherein the first and second sets of memory cells comprise different types of access devices.

7. A memory device, comprising:
   a first set of memory cells comprising respective memory elements including a programmable resistance memory material, the memory elements of memory cells in the first set having an active region with a first geometry;
   a second set of memory cells comprising respective memory elements including a programmable resistance memory material, the memory elements of memory cells in the second set having an active region with a second geometry different than the first geometry such that the first and second sets of memory cells have different operational memory characteristics.

8. The memory device of claim 7, including:
   bias circuitry adapted to apply pulses to control the plurality of memory cells, the pulses including:
   a first pulse applied to program a memory cell in the first set of memory cells to one of low and high resistance states; and
   a second pulse applied to program a memory cell in the second set of memory cells to said one of the low and high resistance states, the first and second pulses having different values for at least one of pulse width and pulse height.

9. The memory device of claim 7, wherein the first and second sets of memory cells are arranged in an array, the first set of memory cells at a first location in the array, the second set of memory cells at a second location in the array.

10. The memory device of claim 7, wherein:
    the first set of memory cells is arranged in a first array at a first location on the substrate; and the second set of memory cells is arranged in a second array at a second location on the substrate and spaced away from the first array.

11. The memory device of claim 7, wherein the first and second memory materials comprise different chalcogenide materials.

12. The memory device of claim 7, wherein the first and second sets of memory cells comprise memory elements having the same physical configuration.

13. The memory device of claim 7, wherein the first and second sets of memory cells comprise memory elements having different physical configurations.

14. The memory device of claim 7, wherein the first and second sets of memory cells comprise different types of access devices.

* * * * *